(12) United States Patent
Che et al.

(10) Patent No.: US 12,052,891 B2
(45) Date of Patent: Jul. 30, 2024

(54) DISPLAYS HAVING TRANSPARENT OPENINGS

(71) Applicant: Apple Inc., Cupertino, CA (US)

(72) Inventors: Yuchi Che, Santa Clara, CA (US); Abbas Jamshidi Roudbari, Saratoga, CA (US); Jean-Pierre S. Guillou, San Diego, CA (US); Majid Esfandyarpour, Redwood City, CA (US); Sebastian Knitter, San Francisco, CA (US); Warren S. Rieutort-Louis, Cupertino, CA (US); Tsung-Ting Tsai, San Jose, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 18/006,519

(22) PCT Filed: Jul. 7, 2021

(86) PCT No.: PCT/US2021/040727
§ 371 (c)(1),
(2) Date: Jan. 23, 2023

(87) PCT Pub. No.: WO2022/035527
PCT Pub. Date: Feb. 17, 2022

(65) Prior Publication Data
US 2023/0337467 A1 Oct. 19, 2023

Related U.S. Application Data

(60) Provisional application No. 63/063,848, filed on Aug. 10, 2020.

(51) Int. Cl.
*H10K 59/121* (2023.01)
*G09G 3/3266* (2016.01)
(Continued)

(52) U.S. Cl.
CPC ....... *H10K 59/1213* (2023.02); *G09G 3/3266* (2013.01); *H10K 59/353* (2023.02); *H10K 59/90* (2023.02)

(58) Field of Classification Search
None
See application file for complete search history.

(56) References Cited

U.S. PATENT DOCUMENTS

| 7,355,606 B2 | 4/2008 | Paquette |
| 7,940,457 B2 | 5/2011 | Jain et al. |

(Continued)

FOREIGN PATENT DOCUMENTS

| CN | 110444125 A | 11/2019 |
| CN | 209728720 U | 12/2019 |

(Continued)

*Primary Examiner* — Stephen T. Reed
(74) *Attorney, Agent, or Firm* — Treyz Law Group, P.C.; Joseph F. Guihan; Jinie M. Guihan

(57) ABSTRACT

An electronic device may include a display and an optical sensor formed underneath the display. The electronic device may include a plurality of transparent windows that overlap the optical sensor. The resolution of the display panel may be reduced in some areas due to the presence of the transparent windows. To mitigate diffraction artifacts, a first sensor (13-1) may sense light through a first pixel removal region having transparent windows arranged according to a first pattern. A second sensor (13-2) may sense light through a second pixel removal region having transparent windows arranged according to a second pattern that is different than the first pattern. The first and second patterns of the transparent windows may result in the first and second sensors having different diffraction artifacts. Therefore, an image from the first sensor may be corrected for diffraction artifacts based on an image from the second sensor.

17 Claims, 32 Drawing Sheets

(51) Int. Cl.
  *H10K 59/35*   (2023.01)
  *H10K 59/90*   (2023.01)

(56)            References Cited

U.S. PATENT DOCUMENTS

| | | |
|---|---|---|
| 8,724,942 B2 | 5/2014 | Logunov et al. |
| 9,098,136 B2 | 8/2015 | Kim |
| 10,163,984 B1 | 12/2018 | Ho et al. |
| 10,268,884 B2 | 4/2019 | Jones et al. |
| 2014/0375704 A1 | 12/2014 | Bi et al. |
| 2015/0241705 A1 | 8/2015 | Abovitz et al. |
| 2016/0266695 A1 | 9/2016 | Bae et al. |
| 2017/0116934 A1 | 4/2017 | Tien et al. |
| 2019/0041658 A1 | 2/2019 | Gollier et al. |
| 2019/0094541 A1 | 3/2019 | Choi et al. |
| 2020/0243794 A1 | 7/2020 | Jones et al. |
| 2021/0202626 A1* | 7/2021 | Jeon .................... H10K 50/822 |
| 2021/0385314 A1* | 12/2021 | An ........................ G06F 1/1618 |
| 2023/0043940 A1* | 2/2023 | Bae ...................... G09G 3/3233 |

FOREIGN PATENT DOCUMENTS

| | | |
|---|---|---|
| CN | 110971805 A | 4/2020 |
| CN | 111417915 A | 7/2020 |
| EP | 3588367 A1 | 1/2020 |
| GB | 201715159 | 11/2017 |
| WO | 2019154072 A1 | 8/2019 |

\* cited by examiner

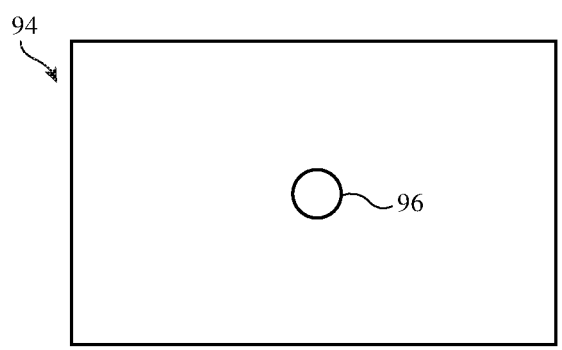
*FIG. 19A*
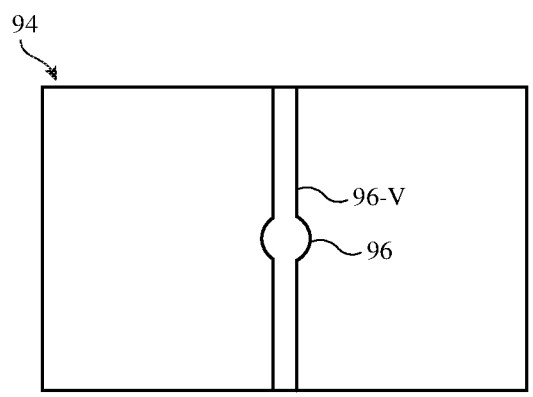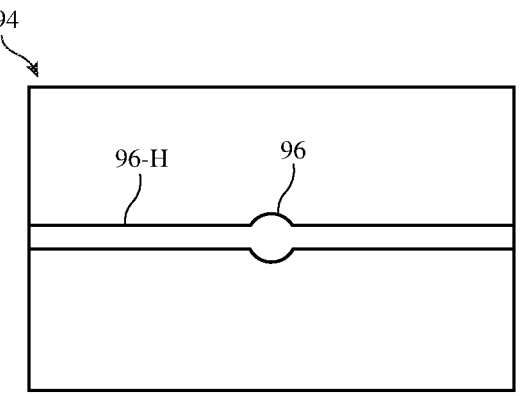
*FIG. 19B*  *FIG. 19C*

DISPLAYS HAVING TRANSPARENT OPENINGS

This application claims priority to U.S. provisional patent application No. 63/063,848, filed Aug. 10, 2020, which is hereby incorporated by reference herein in its entirety.

BACKGROUND

This relates generally to electronic devices, and, more particularly, to electronic devices with displays.

Electronic devices often include displays. For example, an electronic device may have an organic light-emitting diode (OLED) display based on organic light-emitting diode pixels. In this type of display, each pixel includes a light-emitting diode and thin-film transistors for controlling application of a signal to the light-emitting diode to produce light. The light-emitting diodes may include OLED layers positioned between an anode and a cathode.

There is a trend towards borderless electronic devices with a full-face display. These devices, however, may still need to include sensors such as cameras, ambient light sensors, and proximity sensors to provide other device capabilities. Since the display now covers the entire front face of the electronic device, the sensors will have to be placed under the display stack. In practice, however, the amount of light transmission through the display stack is very low (i.e., the transmission might be less than 20% in the visible spectrum), which severely limits the sensing performance under the display.

It is within this context that the embodiments herein arise.

SUMMARY

An electronic device may include a display and an optical sensor formed underneath the display. The electronic device may include a plurality of non-pixel regions that overlap the optical sensor. Each non-pixel region may be devoid of thin-film transistors and other display components. The plurality of non-pixel regions is configured to increase the transmittance of light through the display to the sensor. The non-pixel regions may therefore be referred to as transparent windows in the display.

Light passing through the transparent windows may have associated diffraction artifacts based on the pattern of the transparent windows. To mitigate diffraction artifacts, a first sensor may sense light through a first pixel removal region having transparent windows arranged according to a first pattern. A second sensor may sense light through a second pixel removal region having transparent windows arranged according to a second pattern that is different than the first pattern. The first and second patterns of the transparent windows may result in the first and second sensors having different diffraction artifacts. Therefore, an image from the first sensor may be corrected for diffraction artifacts based on an image from the second sensor. There may be a gradual transition between a full pixel density region of the display and a pixel removal region in the display.

In one arrangement, thin-film transistor sub-pixels may be smaller than a pixel area for a given sub-pixel, providing a transparent opening around the periphery of each thin-film transistor sub-pixel. To mitigate back emission that is sensed by the sensor under the display, the display may include a black pixel definition layer. Additionally light absorbing layers may be coated on metal layers in the thin-film transistor layer of the display to mitigate back emission. Signal lines in the pixel removal region may be transparent.

BRIEF DESCRIPTION OF THE DRAWINGS

FIGS. 19A-19C are top views of illustrative images showing the appearance of a point light source viewed through the display at a sensor in accordance with an embodiment.

DETAILED DESCRIPTION

Figure 1:
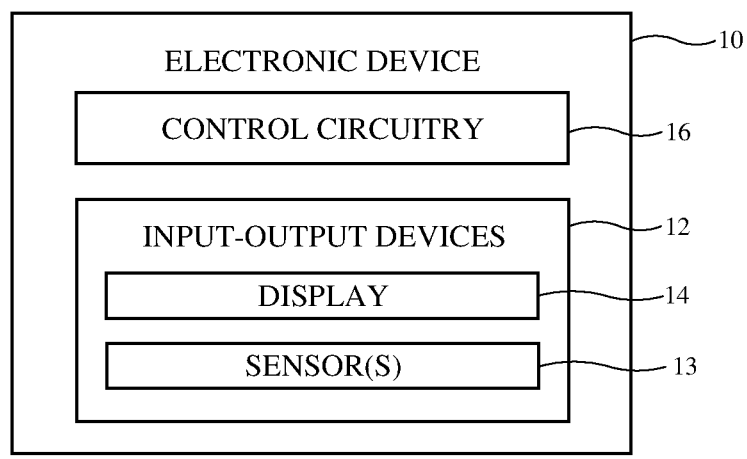
FIG. 1 is a schematic diagram of an illustrative electronic device having a display and one or more sensors in accordance with an embodiment.

An illustrative electronic device of the type that may be provided with a display is shown in FIG. 1. Electronic device 10 may be a computing device such as a laptop computer, a computer monitor containing an embedded computer, a tablet computer, a cellular telephone, a media player, or other handheld or portable electronic device, a smaller device such as a wrist-watch device, a pendant device, a headphone or earpiece device, a device embedded in eyeglasses or other equipment worn on a user's head, or other wearable or miniature device, a display, a computer display that contains an embedded computer, a computer display that does not contain an embedded computer, a gaming device, a navigation device, an embedded system such as a system in which electronic equipment with a display is mounted in a kiosk or automobile, or other electronic equipment. Electronic device 10 may have the shape of a pair of eyeglasses (e.g., supporting frames), may form a housing having a helmet shape, or may have other configurations to help in mounting and securing the components of one or more displays on the head or near the eye of a user.

As shown in FIG. 1, electronic device 10 may include control circuitry 16 for supporting the operation of device 10. Control circuitry 16 may include storage such as hard disk drive storage, nonvolatile memory (e.g., flash memory or other electrically-programmable-read-only memory configured to form a solid-state drive), volatile memory (e.g., static or dynamic random-access memory), etc. Processing circuitry in control circuitry 16 may be used to control the operation of device 10. The processing circuitry may be based on one or more microprocessors, microcontrollers, digital signal processors, baseband processors, power management units, audio chips, application-specific integrated circuits, etc.

Input-output circuitry in device 10 such as input-output devices 12 may be used to allow data to be supplied to device 10 and to allow data to be provided from device 10 to external devices. Input-output devices 12 may include buttons, joysticks, scrolling wheels, touch pads, key pads, keyboards, microphones, speakers, tone generators, vibrators, cameras, sensors, light-emitting diodes and other status indicators, data ports, etc. A user can control the operation of device 10 by supplying commands through input resources of input-output devices 12 and may receive status information and other output from device 10 using the output resources of input-output devices 12.

Input-output devices 12 may include one or more displays such as display 14. Display 14 may be a touch screen display that includes a touch sensor for gathering touch input from a user or display 14 may be insensitive to touch. A touch sensor for display 14 may be based on an array of capacitive touch sensor electrodes, acoustic touch sensor structures, resistive touch components, force-based touch sensor structures, a light-based touch sensor, or other suitable touch sensor arrangements. A touch sensor for display 14 may be formed from electrodes formed on a common display substrate with the display pixels of display 14 or may be formed from a separate touch sensor panel that overlaps the pixels of display 14. If desired, display 14 may be insensitive to touch (i.e., the touch sensor may be omitted). Display 14 in electronic device 10 may be a head-up display that can be viewed without requiring users to look away from a typical viewpoint or may be a head-mounted display that is incorporated into a device that is worn on a user's head. If desired, display 14 may also be a holographic display used to display holograms.

Control circuitry 16 may be used to run software on device 10 such as operating system code and applications. During operation of device 10, the software running on control circuitry 16 may display images on display 14.

Input-output devices 12 may also include one or more sensors 13 such as force sensors (e.g., strain gauges, capacitive force sensors, resistive force sensors, etc.), audio sensors such as microphones, touch and/or proximity sensors such as capacitive sensors (e.g., a two-dimensional capacitive touch sensor associated with a display and/or a touch sensor that forms a button, trackpad, or other input device not associated with a display), and other sensors. In accordance with some embodiments, sensors 13 may include optical sensors such as optical sensors that emit and detect light (e.g., optical proximity sensors such as transreflective optical proximity structures), ultrasonic sensors, and/or other touch and/or proximity sensors, monochromatic and color ambient light sensors, image sensors, fingerprint sensors, temperature sensors, proximity sensors and other sensors for measuring three-dimensional non-contact gestures ("air gestures"), pressure sensors, sensors for detecting position, orientation, and/or motion (e.g., accelerometers, magnetic sensors such as compass sensors, gyroscopes, and/or inertial measurement units that contain some or all of these sensors), health sensors, radio-frequency sensors, depth sensors (e.g., structured light sensors and/or depth sensors based on stereo imaging devices), optical sensors such as self-mixing sensors and light detection and ranging (lidar) sensors that gather time-of-flight measurements, humidity sensors, moisture sensors, gaze tracking sensors, and/or other sensors. In some arrangements, device 10 may use sensors 13 and/or other input-output devices to gather user input (e.g., buttons may be used to gather button press input, touch sensors overlapping displays can be used for gathering user touch screen input, touch pads may be used in gathering touch input, microphones may be used for gathering audio input, accelerometers may be used in monitoring when a finger contacts an input surface and may therefore be used to gather finger press input, etc.).

Display 14 may be an organic light-emitting diode display or may be a display based on other types of display technology (e.g., liquid crystal displays). Device configurations in which display 14 is an organic light-emitting diode display are sometimes described herein as an example. This is, however, merely illustrative. Any suitable type of display may be used, if desired. In general, display 14 may have a rectangular shape (i.e., display 14 may have a rectangular footprint and a rectangular peripheral edge that runs around the rectangular footprint) or may have other suitable shapes. Display 14 may be planar or may have a curved profile.

Figure 2:
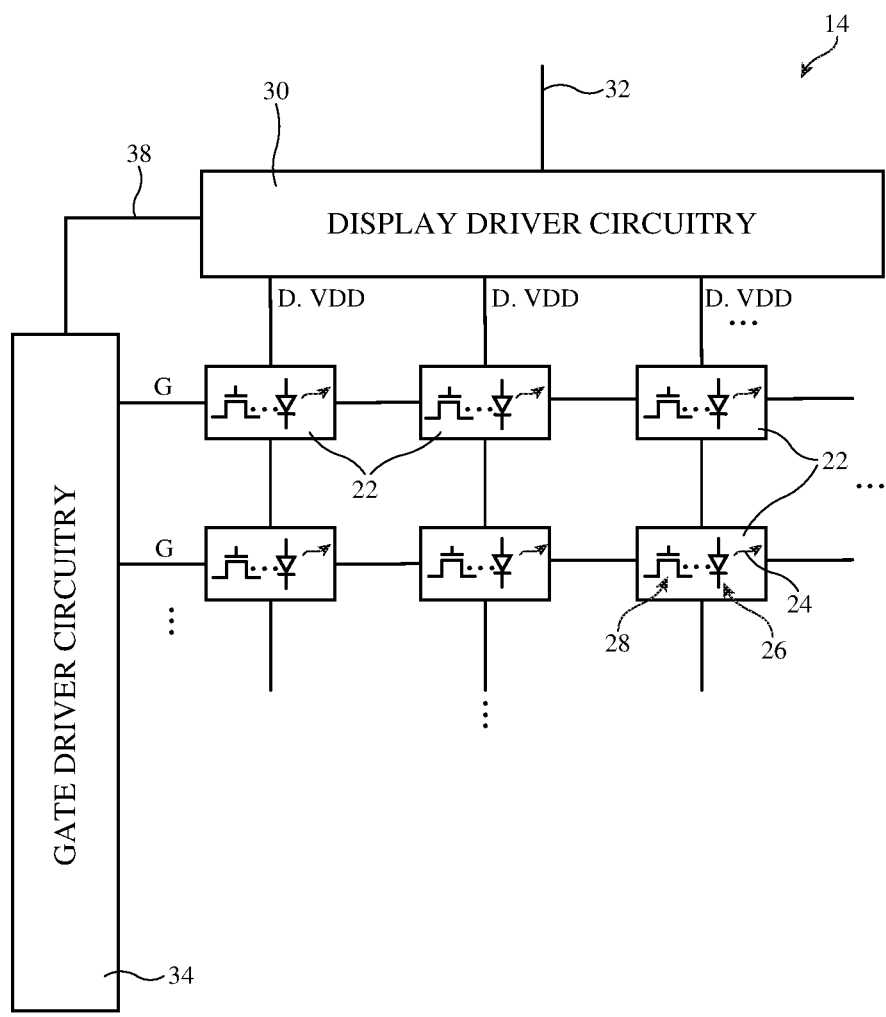
FIG. 2 is a schematic diagram of an illustrative display with light-emitting elements in accordance with an embodiment.

A top view of a portion of display 14 is shown in FIG. 2. As shown in FIG. 2, display 14 may have an array of pixels 22 formed on a substrate. Pixels 22 may receive data signals over signal paths such as data lines D and may receive one or more control signals over control signal paths such as horizontal control lines G (sometimes referred to as gate lines, scan lines, emission control lines, etc.). There may be any suitable number of rows and columns of pixels 22 in display 14 (e.g., tens or more, hundreds or more, or thousands or more). Each pixel 22 may include a light-emitting diode 26 that emits light 24 under the control of a pixel control circuit formed from thin-film transistor circuitry such as thin-film transistors 28 and thin-film capacitors. Thin-film transistors 28 may be polysilicon thin-film transistors, semiconducting-oxide thin-film transistors such as indium zinc gallium oxide (IGZO) transistors, or thin-film transistors formed from other semiconductors. Pixels 22 may contain light-emitting diodes of different colors (e.g., red, green, and blue) to provide display 14 with the ability to display color images or may be monochromatic pixels.

Display driver circuitry may be used to control the operation of pixels 22. The display driver circuitry may be formed from integrated circuits, thin-film transistor circuits, or other suitable circuitry. Display driver circuitry 30 of FIG. 2 may contain communications circuitry for communicating with system control circuitry such as control circuitry 16 of FIG. 1 over path 32. Path 32 may be formed from traces on a flexible printed circuit or other cable. During operation, the control circuitry (e.g., control circuitry 16 of FIG. 1) may supply display driver circuitry 30 with information on images to be displayed on display 14.

To display the images on display pixels 22, display driver circuitry 30 may supply image data to data lines D while issuing clock signals and other control signals to supporting display driver circuitry such as gate driver circuitry 34 over path 38. If desired, display driver circuitry 30 may also supply clock signals and other control signals to gate driver circuitry 34 on an opposing edge of display 14.

Gate driver circuitry 34 (sometimes referred to as row control circuitry) may be implemented as part of an integrated circuit and/or may be implemented using thin-film transistor circuitry. Horizontal control lines G in display 14 may carry gate line signals such as scan line signals, emission enable control signals, and other horizontal control signals for controlling the display pixels 22 of each row. There may be any suitable number of horizontal control signals per row of pixels 22 (e.g., one or more row control signals, two or more row control signals, three or more row control signals, four or more row control signals, etc.).

The region on display 14 where the display pixels 22 are formed may sometimes be referred to herein as the active area. Electronic device 10 has an external housing with a peripheral edge. The region surrounding the active area and within the peripheral edge of device 10 is the border region. Images can only be displayed to a user of the device in the active region. It is generally desirable to minimize the border region of device 10. For example, device 10 may be provided with a full-face display 14 that extends across the entire front face of the device. If desired, display 14 may also wrap around over the edge of the front face so that at least part of the lateral edges or at least part of the back surface of device 10 is used for display purposes.

Figure 3:
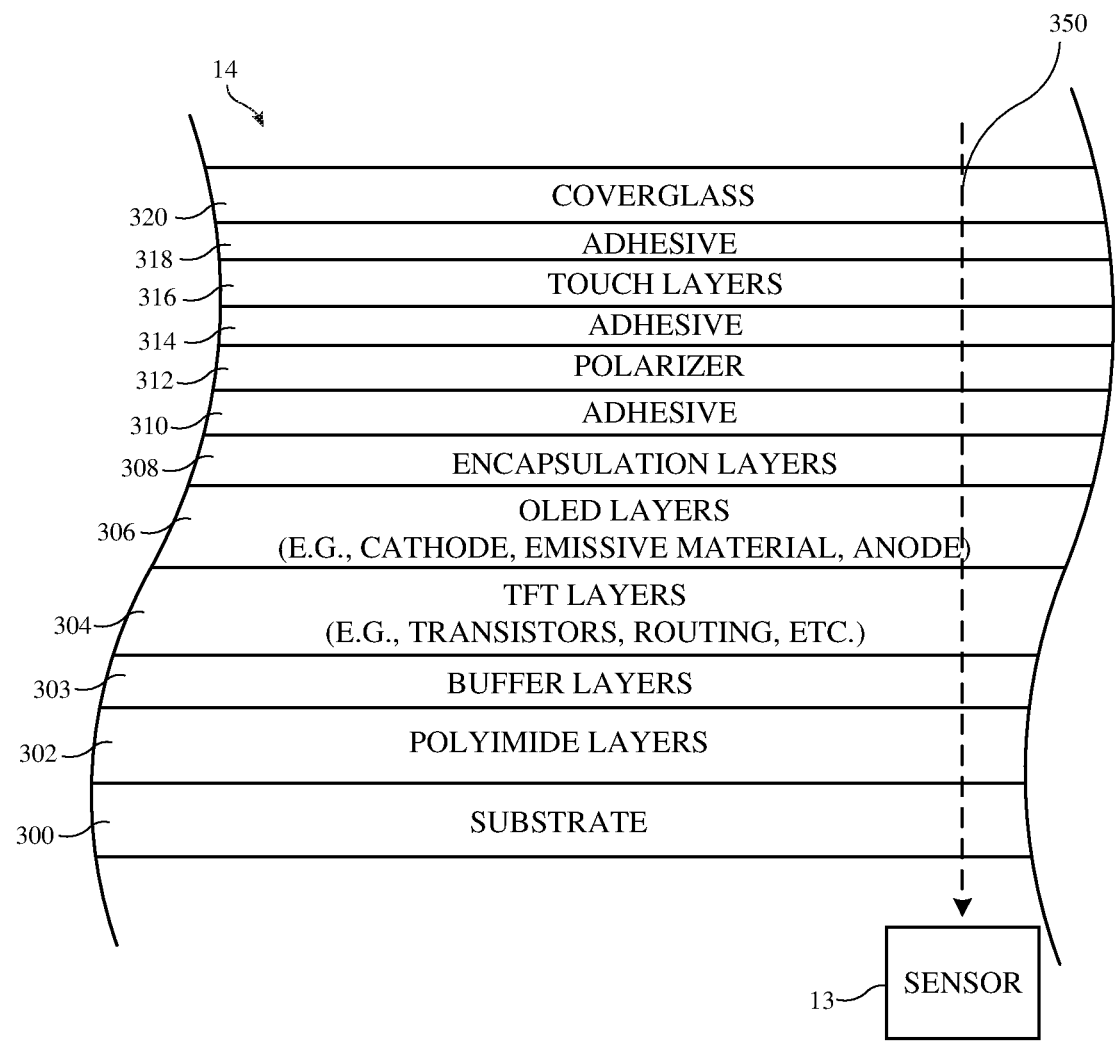
FIG. 3 is a cross-sectional side view of an illustrative display stack that at least partially covers a sensor in accordance with an embodiment.

Device 10 may include a sensor 13 mounted behind display 14 (e.g., behind the active area of the display). FIG. 3 is a cross-sectional side view of an illustrative display stack of display 14 that at least partially covers a sensor in accordance with an embodiment. As shown in FIG. 3, the display stack may include a substrate such as substrate 300. Substrate 300 may be formed from glass, metal, plastic, ceramic, sapphire, or other suitable substrate materials. In some arrangements, substrate 300 may be an organic substrate formed from polyethylene terephthalate (PET) or polyethylene naphthalate (PEN) (as examples). One or more polyimide (PI) layers 302 may be formed over substrate 300. The polyimide layers may sometimes be referred to as an organic substrate (e.g., substrate 300 is a first substrate layer and substrate 302 is a second substrate layer). The surface of substrate 302 may optionally be covered with one or more buffer layers 303 (e.g., inorganic buffer layers such as layers of silicon oxide, silicon nitride, amorphous silicon, etc.).

Thin-film transistor (TFT) layers 304 may be formed over inorganic buffer layers 303 and organic substrates 302 and 300. The TFT layers 304 may include thin-film transistor circuitry such as thin-film transistors, thin-film capacitors, associated routing circuitry, and other thin-film structures formed within multiple metal routing layers and dielectric layers. Organic light-emitting diode (OLED) layers 306 may be formed over the TFT layers 304. The OLED layers 306 may include a diode cathode layer, a diode anode layer, and emissive material interposed between the cathode and anode layers. The OLED layers may include a pixel definition layer that defines the light-emitting area of each pixel. The TFT circuitry in layer 304 may be used to control an array of display pixels formed by the OLED layers 306.

Circuitry formed in the TFT layers 304 and the OLED layers 306 may be protected by encapsulation layers 308. As an example, encapsulation layers 308 may include a first inorganic encapsulation layer, an organic encapsulation layer formed on the first inorganic encapsulation layer, and a second inorganic encapsulation layer formed on the organic encapsulation layer. Encapsulation layers 308 formed in this way can help prevent moisture and other potential contaminants from damaging the conductive circuitry that is covered by layers 308. Substrate 300, polyimide layers 302, buffer layers 303, TFT layers 304, OLED layers 306, and encapsulation layers 308 may be collectively referred to as a display panel.

One or more polarizer films 312 may be formed over the encapsulation layers 308 using adhesive 310. Adhesive 310 may be implemented using optically clear adhesive (OCA) material that offer high light transmittance. One or more touch layers 316 that implement the touch sensor functions of touch-screen display 14 may be formed over polarizer films 312 using adhesive 314 (e.g., OCA material). For example, touch layers 316 may include horizontal touch sensor electrodes and vertical touch sensor electrodes collectively forming an array of capacitive touch sensor electrodes. Lastly, the display stack may be topped off with a cover glass layer 320 (sometimes referred to as a display cover layer 320) that is formed over the touch layers 316 using additional adhesive 318 (e.g., OCA material). display cover layer 320 may be a transparent layer (e.g., transparent plastic or glass) that serves as an outer protective layer for display 14. The outer surface of display cover layer 320 may form an exterior surface of the display and the electronic device that includes the display.

Still referring to FIG. 3, sensor 13 may be formed under the display stack within the electronic device 10. As described above in connection with FIG. 1, sensor 13 may be an optical sensor such as a camera, proximity sensor, ambient light sensor, fingerprint sensor, or other light-based sensor. In such scenarios, the performance of sensor 13 depends on the transmission of light traversing through the display stack, as indicated by arrow 350. A typical display stack, however, has fairly limited transmission properties. For instance, more than 80% of light in the visible and infrared light spectrum might be lost when traveling through the display stack, which makes sensing under display 14 challenging.

Each of the multitude of layers in the display stack contributes to the degraded light transmission to sensor 13. In particular, the dense thin-film transistors and associated routing structures in TFT layers 304 of the display stack contribute substantially to the low transmission. In accordance with an embodiment, at least some of the display pixels may be selectively removed in regions of the display stack located directly over sensor(s) 13. Regions of display 14 that at least partially cover or overlap with sensor(s) 13 in which at least a portion of the display pixels have been removed are sometimes referred to as pixel removal regions or pixel free regions. Removing display pixels (e.g., removing transistors and/or capacitors associated with one or more sub-pixels) in the pixel free regions can drastically help increase transmission and improve the performance of the under-display sensor 13. In addition to removing display pixels, portions of additional layers such as polyimide layers 302 and/or substrate 300 may be removed for additional transmission improvement. Polarizer 312 may also be bleached for additional transmission improvement.

Figure 4:
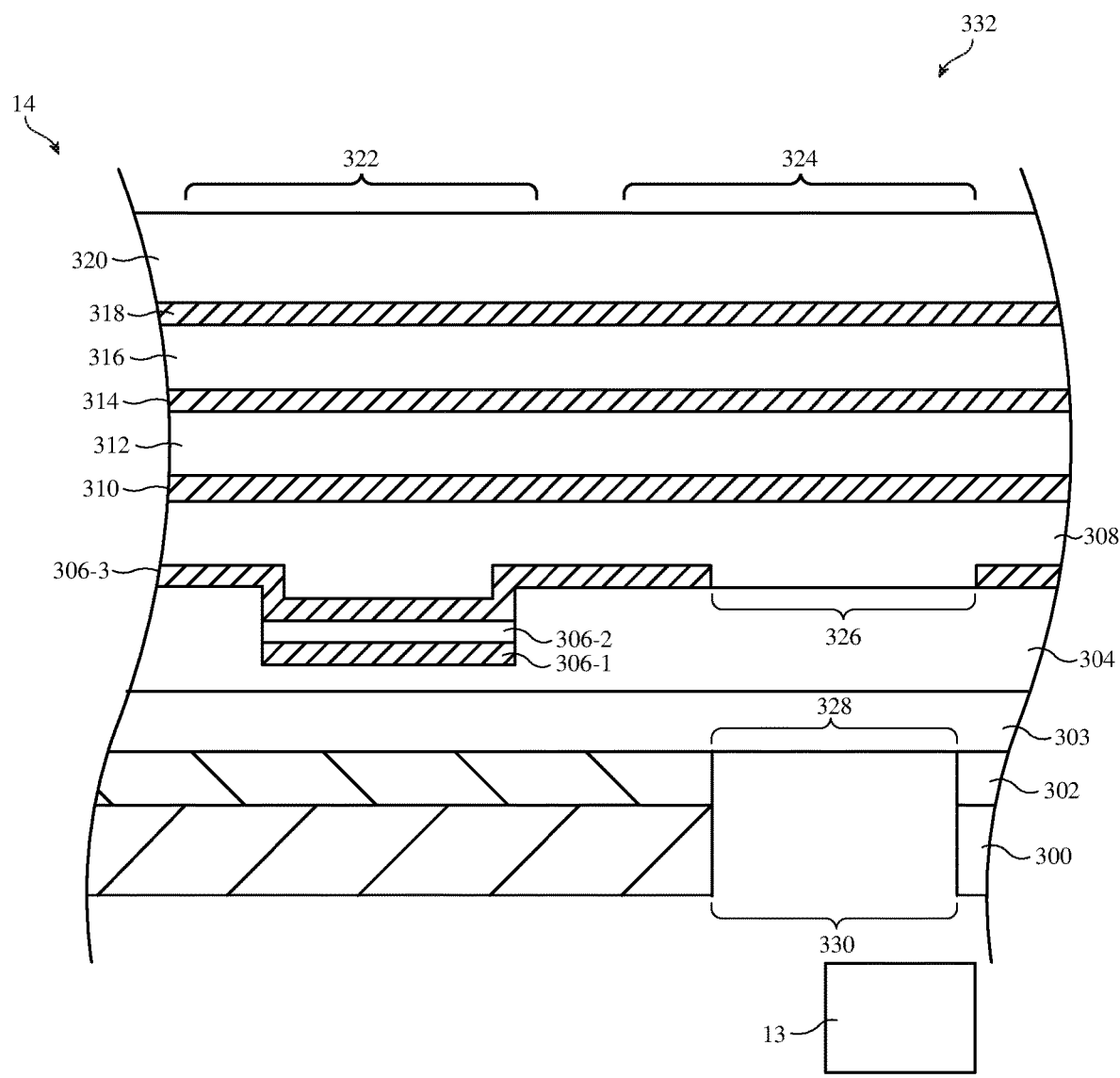
FIG. 4 is a cross-sectional side view of an illustrative display stack with a pixel removal region having a transparent opening in accordance with an embodiment.

FIG. 4 is a cross-sectional side view of an illustrative pixel removal region of a display showing how pixels may be removed to increase transmission through the display. As shown in FIG. 4, display 14 may include a pixel removal region 332 (sometimes referred to as reduced pixel density region 332, low pixel density region 332, etc.). The pixel removal region may include some pixels (e.g., in pixel region 322) and some areas with removed components for increased transmittance (e.g., opening 324). Opening 324 has a higher transmittance than pixel region 322. Opening 324 may sometimes be referred to as high-transmittance area 324, window 324, display opening 324, display window 324, pixel-devoid region 324, etc. In the pixel region 322, the display may include a pixel formed from emissive material 306-2 that is interposed between an anode 306-1 and a cathode 306-3. Signals may be selectively applied to anode 306-1 to cause emissive material 306-2 to emit light for the pixel. Circuitry in thin-film transistor layer 304 may be used to control the signals applied to anode 306-1.

In display window 324, anode 306-1 and emissive material 306-2 may be omitted. Without the display window, an additional pixel may be formed in area 324 adjacent to the pixel in area 322 (according to the pixel pattern). However, to increase the transmittance of light to sensor 13 under the display, the pixel(s) in area 324 are removed. The absence of emissive material 306-2 and anode 306-1 may increase the transmittance through the display stack. Additional circuitry within thin-film transistor layer 304 may also be omitted in pixel removal area to increase transmittance.

Additional transmission improvements through the display stack may be obtained by selectively removing additional components from the display stack in high-transmittance area 324. As shown in FIG. 4, a portion of cathode 306-3 may be removed in high-transmittance area 324. This results in an opening 326 in the cathode 306-3. Said another way, the cathode 306-3 may have conductive material that defines an opening 326 in the pixel removal region. Removing the cathode in this way allows for more light to pass through the display stack to sensor 13. Cathode 306-3 may be formed from any desired conductive material. The cathode may be removed via etching (e.g., laser etching or plasma etching). Alternatively, the cathode may be patterned to have an opening in pixel removal region 324 during the original cathode deposition and formation steps.

Polyimide layers 302 may be removed in high-transmittance area 324 in addition to cathode layer 306-3. The removal of the polyimide layers 302 results in an opening 328 in the pixel removal region. Said another way, the polyimide layer may have polyimide material that defines an opening 328 in the pixel removal region. The polyimide layers may be removed via etching (e.g., laser etching or plasma etching). Alternatively, the polyimide layers may be patterned to have an opening in high-transmittance area 324 during the original polyimide formation steps. Removing the polyimide layer 302 in high-transmittance area 324 may result in additional transmittance of light to sensor 13 in high-transmittance area 324.

Substrate 300 may be removed in high-transmittance area 324 in addition to cathode layer 306-3 and polyimide layer 302. The removal of the substrate 300 results in an opening 330 in the pixel removal region. Said another way, the substrate 300 may have material (e.g., PET, PEN, etc.) that defines an opening 330 in the pixel removal region. The substrate may be removed via etching (e.g., with a laser). Alternatively, the substrate may be patterned to have an opening in high-transmittance area 324 during the original substrate formation steps. Removing the substrate 300 in high-transmittance area 324 may result in additional transmittance of light to sensor 13 in high-transmittance area 324. The polyimide opening 328 and substrate opening 330 may be considered to form a single unitary opening. When removing portions of polyimide layer 302 and/or substrate 300, inorganic buffer layers 303 may serve as an etch stop for the etching step. Openings 328 and 330 may be filled with air or another desired transparent filler.

In addition to having openings in cathode 306-3, polyimide layers 302, and/or substrate 300, the polarizer 312 in the display may be bleached for additional transmittance in the pixel removal region.

Figure 5:
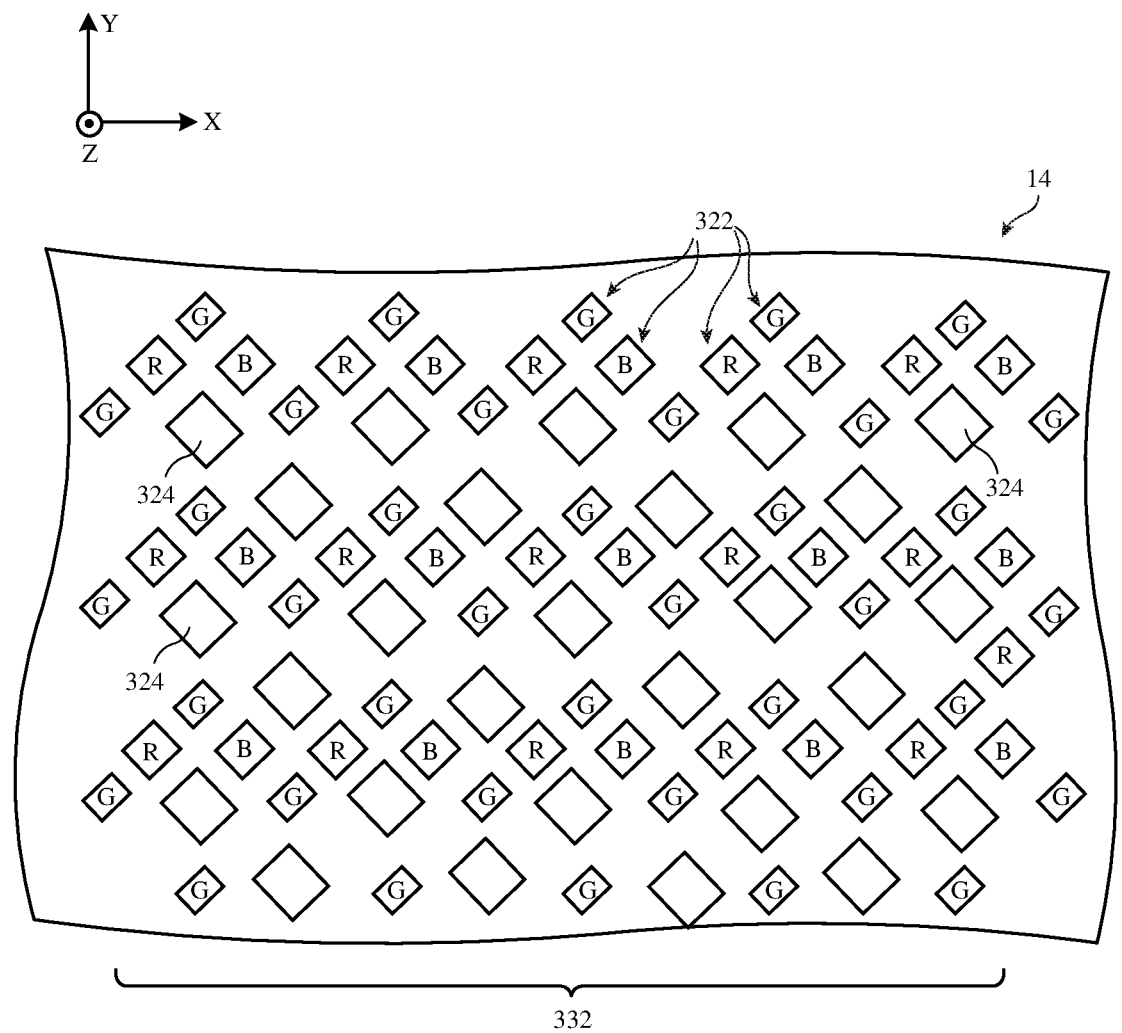
FIG. 5 is a top view of an illustrative display with transparent openings that overlap a sensor in accordance with an embodiment.

FIG. 5 is a top view of an illustrative display showing how a pixel removal region including a number of high-transmittance areas may be incorporated into the display. The pixel removal region 332 includes display pixel regions 322 and high-transmittance areas 324. As shown, the display may include a plurality of pixels. In FIG. 5, there are a plurality of red pixels (R), a plurality of blue pixels (B), and a plurality of green pixels (G). The red, blue, and green pixels may be arranged in any desired pattern. The red, blue, and green pixels occupy pixel regions 322. In high-transmittance areas 324, no pixels are included in the display (even though pixels would be present if the normal pixel pattern was followed).

As shown in FIG. 5, display 14 may include an array of high-transmittance areas 324. Each high-transmittance area 324 may have an increased transparency compared to pixel region 322. Therefore, the high-transmittance areas 324 may sometimes be referred to as transparent windows 324, transparent display windows 324, transparent openings 324, transparent display openings 324, etc. The transparent display windows 324 may be referred to as transparent display windows in the active area of the display. The transparent display windows may allow for light to be transmitted to an underlying sensor, as shown in FIGS. 3 and 4. The transparency of high-transmittance areas 324 (for visible and/or infrared light) may be greater than 25%, greater than 30%, greater than 40%, greater than 50%, greater than 60%, greater than 70%, greater than 80%, greater than 90%, etc. The transparency of transparent openings 324 may be greater than the transparency of pixel region 322. The transparency of pixel region 322 may be less than 25%, less than 20%, less than 10%, less than 5%, etc. The pixel region 322 may sometimes be referred to as opaque display region 322, opaque region 322, opaque footprint 322, etc. Opaque region 322 includes light emitting pixels R, G, and B, and blocks light from passing through the display to an underlying sensor 13.

The pattern of pixels (322) and transparent openings (324) in FIG. 5 is merely illustrative. In FIG. 5, discrete transparent openings 324 are depicted. However, it should be understood that these transparent openings may form larger, unitary transparent openings if desired.

In FIG. 5, the display edge may be parallel to the X axis or the Y axis. The front face of the display may be parallel to the XY plane such that a user of the device views the front face of the display in the Z direction. In FIG. 5, every other subpixel may be removed for each color. The resulting pixel configuration has 50% of the subpixels removed. In FIG. 5, the remaining pixels follow a zig-zag pattern across the display (with two green sub-pixels for every one red or blue sub-pixel). In FIG. 5, the sub-pixels are angled relative to the edges of the display (e.g., the edges of the sub-pixels are at non-zero, non-orthogonal angles relative to the X-axis and Y-axis). This example is merely illustrative. If desired, each individual subpixel may have edges parallel to the display edge, a different proportion of pixels may be removed for different colors, the remaining pixels may follow a different pattern, etc.

Figure 6:
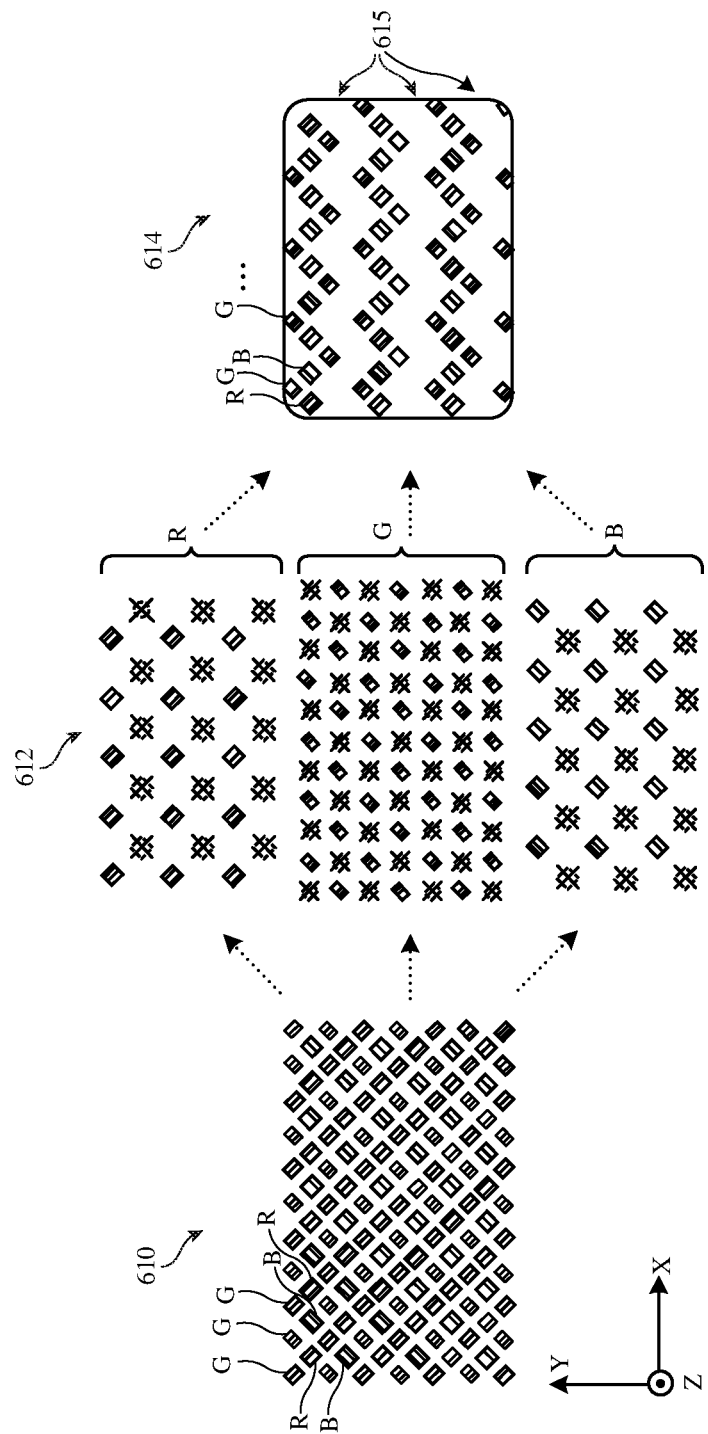
FIG. 6 is a top view showing an illustrative pixel removal scheme in accordance with an embodiment.

To provide a uniform distribution of subpixels across the display surface, an intelligent pixel removal process may be implemented that systematically eliminates the closest subpixel of the same color (e.g., the nearest neighbor of the same color may be removed). FIG. 6 is a top layout view showing how subpixels can be systematically removed in accordance with an embodiment. As shown in FIG. 6, display 14 may be initially provided with an array of red (R), green (G), and blue (B) subpixels. The pixel removal process may involve, for each color, selecting a given subpixel, identifying the closest or nearest neighboring subpixels of the same color (in terms of distance from the selected subpixel), and then eliminating/omitting those identified subpixels in the final pixel removal region.

In FIG. 6, the display edge may be parallel to the X axis or the Y axis. The front face of the display may be parallel to the XY plane such that a user of the device views the front face of the display in the Z direction. Portion 610 of FIG. 6 shows the native subpixel arrangement prior to removal. Portion 612 illustrates how every other subpixel may be removed for each color (the removed subpixels are marked using "X"). Portion 614 shows the resulting pixel configuration with 50% of the subpixels removed. If desired, additional iterations of subpixel removal may be performed to further increase transmittance at the expense of lower pixel density.

In the example of FIG. 6, the subpixels are removed such that there are horizontal stripes of empty pixel regions (see, e.g., continuous striping regions 615 devoid of subpixels in portion 614). This is merely illustrative. If desired, the subpixels may also be removed to create vertical stripes of empty pixel regions (see, e.g., FIG. 7 having contiguous striping regions 617 devoid of subpixels).

Figure 7:
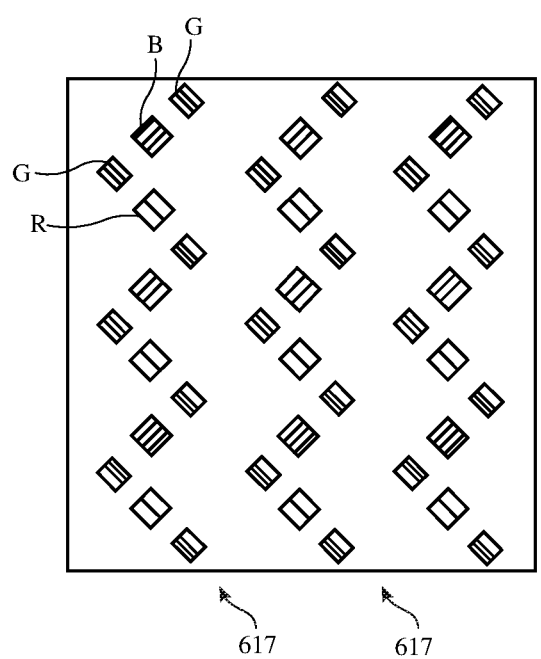
FIG. 7 is a top view of an illustrative display with a vertical zig-zag pixel pattern in accordance with an embodiment.

FIGS. 5-7 show examples of pixel removal regions where some sub-pixels are removed in favor of transparent openings in the display. FIGS. 5-7 show a layout for sub-pixels within the pixel removal region. It should be noted that these layouts are for the emissive layer of each sub-pixel.

Each display pixel 22 may include both a thin-film transistor layer and an emissive layer. Each emissive layer portion may have associated circuitry on the thin-film transistor layer that controls the magnitude of light emitted from that emissive layer portion. Both the emissive layer and thin-film transistor layer may have corresponding sub-pixels within the pixel. Each sub-pixel may be associated with a different color of light (e.g., red, green, and blue). The emissive layer portion for a given sub-pixel does not necessarily need to have the same footprint as its associated thin-film transistor layer portion. Hereinafter, the term sub-pixel may sometimes be used to refer to the combination of an emissive layer portion and a thin-film transistor layer portion. Additionally, the thin-film transistor layer may be referred to as having thin-film transistor sub-pixels (e.g., a portion of the thin-film transistor layer that controls a respective emissive area, sometimes referred to as thin-film transistor layer sub-pixels or simply sub-pixels) and the emissive layer may be referred to as having emissive layer sub-pixels (sometimes referred to as emissive sub-pixels or simply sub-pixels).

Different arrangements may be used for the thin-film transistor sub-pixels and the emissive layer sub-pixels. FIG. 6 shows an example where emissive layer sub-pixels have a horizontal zig-zag arrangement following the pixel removal scheme. Accordingly, transparent openings extend horizontally across the display in FIG. 6. This emissive layer sub-pixel arrangement may have multiple different possible associated thin-film transistor sub-pixel arrangements, as shown in FIGS. 8-13.

Figure 8:
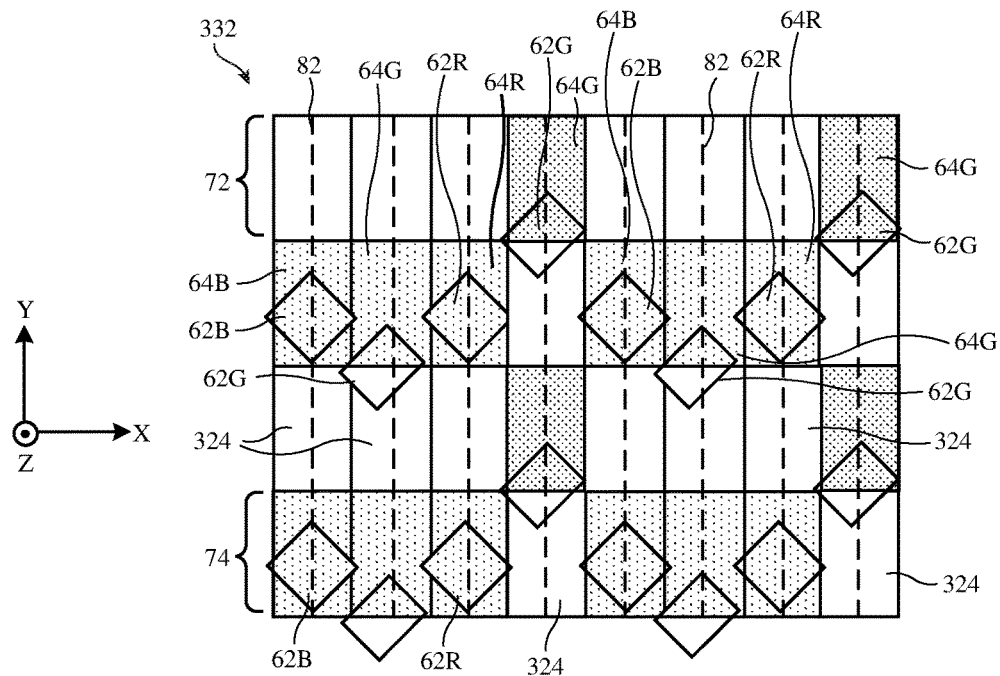
FIG. 8 is a top view of an illustrative display having a repeating pattern of three thin-film transistor sub-pixels and one transparent opening in every other row in accordance with an embodiment.

As shown in FIG. 8, the pixel removal region 332 may include red emissive layer sub-pixels 62R, green emissive layer sub-pixels 62G, and blue emissive layer sub-pixels 62B. The emissive layer sub-pixels 62R, 62G, and 62R have the same arrangement as shown in FIG. 6 (e.g., horizontal zig-zag arrangement). Each emissive layer sub-pixel has a corresponding thin-film transistor sub-pixel. As shown in FIG. 8, each red emissive layer sub-pixel 62R has a corresponding red thin-film transistor sub-pixel 64R, each green emissive layer sub-pixel 62G has a corresponding green thin-film transistor sub-pixel 64G, and each blue emissive layer sub-pixel 62B has a corresponding blue thin-film transistor sub-pixel 64B. Each thin-film transistor sub-pixel controls the magnitude of light emitted from its corresponding emissive layer sub-pixel. For example, the left-most thin-film transistor layer 64B controls the magnitude of light emitted from its corresponding emissive layer sub-pixel 62B. The left-most thin-film transistor layer 64G controls the magnitude of light emitted from its corresponding emissive layer sub-pixel 62G. The left-most thin-film transistor layer 64R controls the magnitude of light emitted from its corresponding emissive layer sub-pixel 62R.

As shown in FIG. 8, transparent openings 324 are formed in the areas between thin-film transistor sub-pixels 64. In general, the emissive layer sub-pixels overlap the thin-film transistor sub-pixels. Therefore, the thin-film transistor sub-pixels primarily define the area for transparent openings 324 in pixel removal region 332. However, the thin-film transistor sub-pixels and emissive layer sub-pixels may optionally have partially or completely non-overlapping footprints.

In FIG. 8, every other row of sub-pixels (e.g., row 74) includes a repeating pattern of three thin-film transistor sub-pixels and one transparent display opening 324. Every other row of sub-pixels (e.g., row 72) includes a repeating pattern of three transparent display openings 324 and one thin-film transistor sub-pixel. It should be noted that each omitted thin-film transistor sub-pixel may be considered a respective transparent openings (e.g., three adjacent transparent openings 324 in row 72). Alternatively, the adjacent transparent openings for three omitted thin-film transistor sub-pixels may collectively be referred to as a single transparent opening.

FIG. 8 also shows how signal lines may extend across the pixel removal region of the display. Signals lines 82 may be, for example, data lines that provide pixel data to the thin-film transistor sub-pixels, gate lines that provide control signals to the thin-film transistor sub-pixels, or another desired type of signal line. In FIG. 8, each signal line 82 extends vertically within a respective column. The signal lines in FIG. 8 may be linear throughout the pixel removal region 332.

Figure 9:
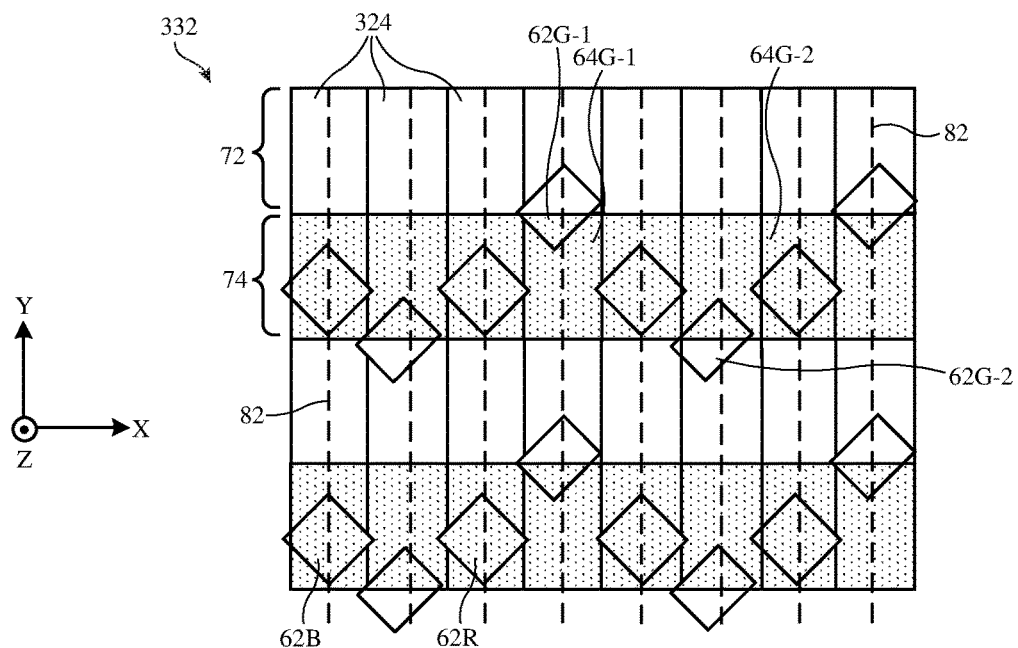
FIG. 9 is a top view of an illustrative display having a continuous strip of thin-film transistor sub-pixels in every other row in accordance with an embodiment.

FIG. 9 shows an alternate thin-film sub-pixel arrangement where every other row (e.g., row 72) includes no thin-film transistor sub-pixels and every other row (e.g., row 74) includes a continuous strip of thin-film transistor sub-pixels. In FIG. 9, the strips of thin-film transistor sub-pixels 64 extend horizontally across the pixel removal region 332 (e.g., parallel to the X-axis). The thin-film transistor sub-pixels extend parallel to the rows of emissive sub-pixels 62 (which extend in a horizontal zig-zag pattern in the X-direction).

As shown in FIG. 9, this arrangement may result in some emissive layer sub-pixels being majority non-overlapping with respective thin-film transistor sub-pixels. For example, the majority of sub-pixel 62G-1 does not vertically overlap (e.g., in the Z-direction) its corresponding thin-film transistor sub-pixel 64G-1. However, thin-film transistor sub-pixel 64G-1 may still effectively control the emission of light from emissive layer sub-pixel 62G-1. The arrangement of FIG. 9 also includes sub-pixels where the majority of the emissive layer sub-pixel overlaps its respective thin-film transistor sub-pixel (e.g., emissive layer sub-pixel 62G-2 is primarily overlapping thin-film transistor sub-pixel 64G-2).

In FIG. 9, each signal line 82 extends vertically within a respective column, similar to as in FIG. 8.

Figure 10:
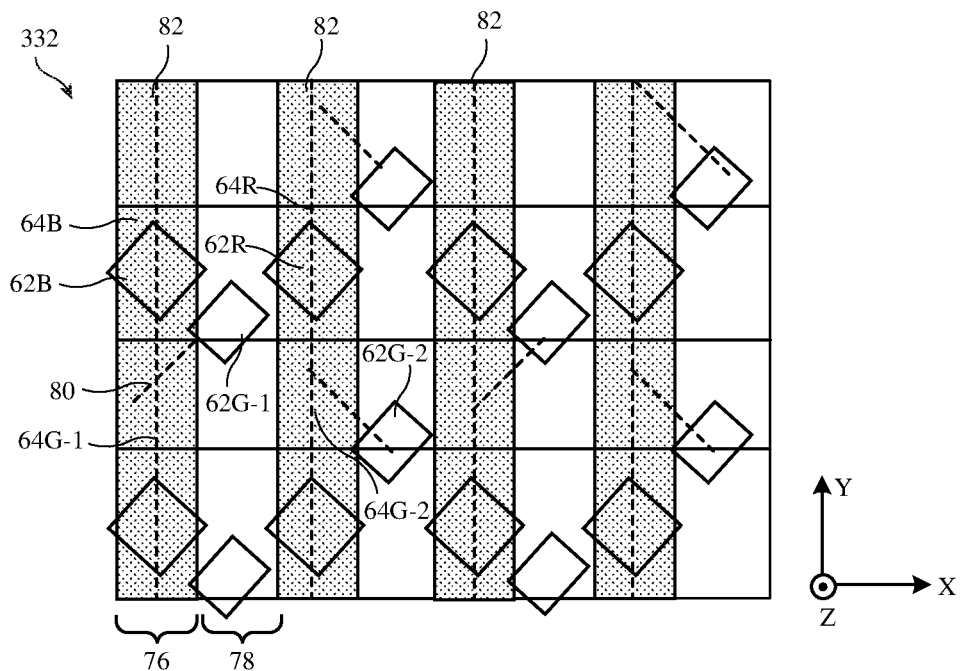
FIG. 10 is a top view of an illustrative display having a continuous strip of thin-film transistor sub-pixels in every other column in accordance with an embodiment.

The thin-film transistor sub-pixels may instead extend orthogonally to the rows of emissive layer sub-pixels 62. In FIG. 10, the thin-film transistor sub-pixels extend in vertical strips across the pixel removal region. As shown, every other column (e.g., column 78) includes no thin-film transistor sub-pixels and every other column (e.g., column 76) includes a continuous strip of thin-film transistor sub-pixels. In FIG. 10, the strips of thin-film transistor sub-pixels 64 extend vertically across the pixel removal region 332 (e.g., parallel to the Y-axis). The thin-film transistor sub-pixels extend orthogonal to the rows of emissive layer sub-pixels 62 (which extend in a horizontal zig-zag pattern in the X-direction).

As shown in FIG. 10, this arrangement may result in some emissive sub-pixels having footprints with little to no overlap with a respective thin-film transistor sub-pixel. For example, little to none of sub-pixel 62G-1 (e.g., less than 10%, less than 5%, less than 1%, etc.) vertically overlaps (e.g., in the Z-direction) its corresponding thin-film transistor sub-pixel 64G-1. However, thin-film transistor sub-pixel 64G-1 may still effectively control the emission of light from emissive sub-pixel 62G-1 (as indicated by dashed line 80). Similarly, little to none of sub-pixel 62G-2 (e.g., less than 30%, less than 10%, less than 5%, less than 1%, etc.) vertically overlaps (e.g., in the Z-direction) its corresponding thin-film transistor sub-pixel 64G-2. However, thin-film transistor sub-pixel 64G-2 may still effectively control the emission of light from emissive layer sub-pixel 62G-2 (as indicated by dashed line 80).

In FIG. 10, each signal line 82 extends vertically within a respective column. However, a signal line is only needed for every other column (since the thin-film transistor sub-pixels are only included in every other column).

Figure 11:
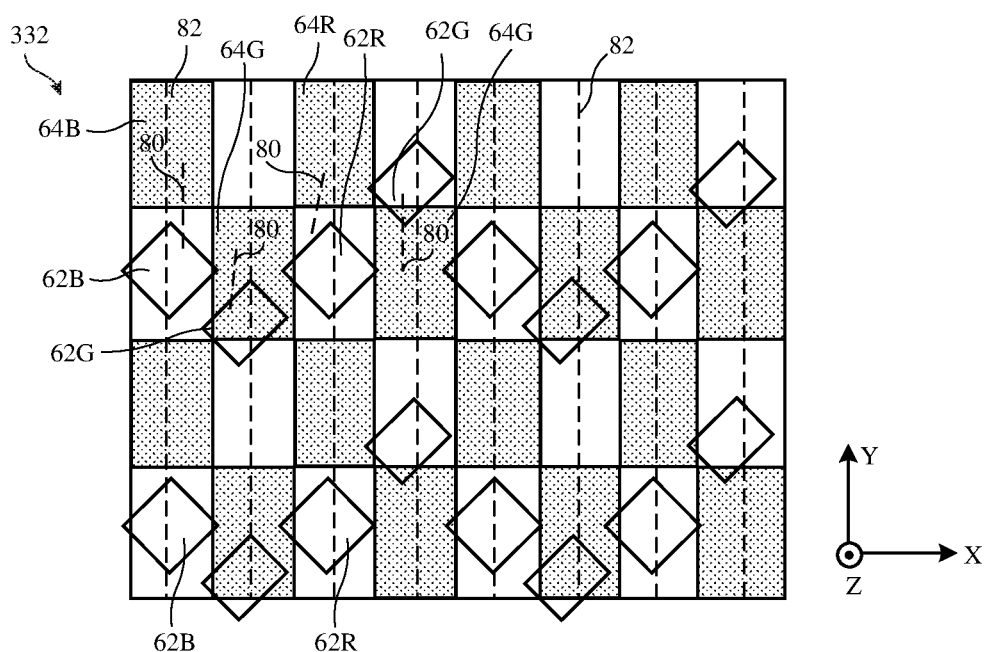
FIG. 11 is a top view of an illustrative display having a checkerboard pattern of thin-film transistor sub-pixels and vertical signal lines in accordance with an embodiment.

FIG. 11 shows yet another thin-film sub-pixel arrangement for the horizontal zig-zag emissive layer sub-pixel pattern of FIGS. 5 and 6. In FIG. 11, every row includes alternating thin-film transistor sub-pixels and transparent openings to form a checkerboard pattern. This arrangement may result in some emissive layer sub-pixels having footprints with little to no overlap with a respective thin-film transistor sub-pixel. However, each thin-film transistor sub-pixel 64 may still effectively control the emission of light from a corresponding emissive layer sub-pixel. Dashed lines 80 indicate the connection between corresponding thin-film transistor sub-pixels and emissive layer sub-pixels.

In FIG. 11, each signal line 82 extends vertically within a respective column, similar to as in FIG. 8.

In FIGS. 8-11, each signal line extends vertically within a respective column. This example is merely illustrative. It should be noted that the signal lines may pass through transparent openings 324, therefore blocking some amount of the light that passes through transparent openings 324. However, signal lines 82 may be sufficiently thin and/or transparent for the underlying sensor to still receive sufficient amounts of light through the transparent openings 324.

Figure 12:
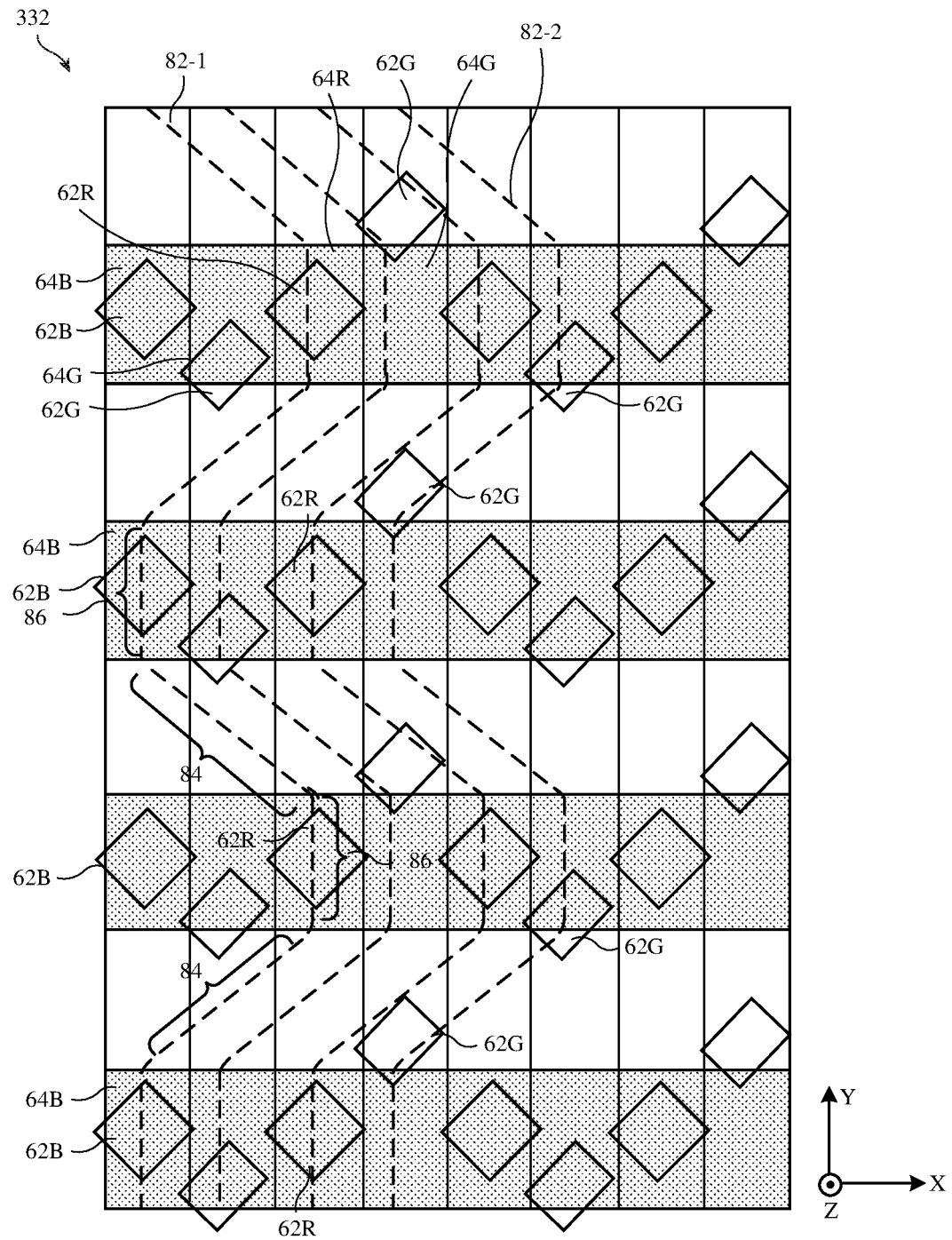
FIG. 12 is a top view of an illustrative display having a continuous horizontal strip of thin-film transistor sub-pixels in every other row and zig-zag signal lines in accordance with an embodiment.
Figure 13:
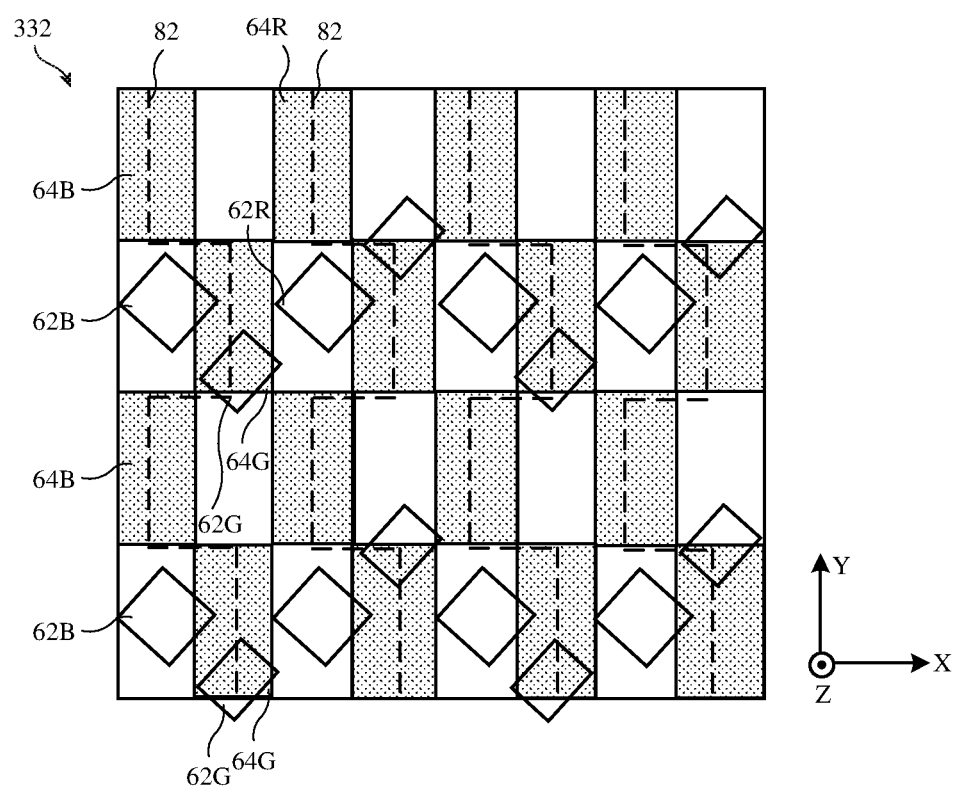
FIG. 13 is a top view of an illustrative display having a checkerboard pattern of thin-film transistor sub-pixels and non-linear signal lines in accordance with an embodiment.

In FIGS. 12 and 13, the signal lines have one or more non-vertical portions within pixel removal region 332. FIG. 12 shows an example where the signal lines have a zig-zag shape (sometimes referred to as a chevron shape). In FIG. 12, the emissive layer sub-pixels 62 and the thin-film transistor sub-pixels 64 have the same arrangement as in FIG. 9. However, the signal paths 82 have a unique arrangement in FIG. 12.

As shown in FIG. 12, each signal path 82 may have a plurality of vertical portions 86 (sometimes referred to as vertical segments) and a plurality of diagonal portions 84 (sometimes referred to as diagonal segments). Each vertical portion 86 extends vertically across the pixel removal region 332 of the display (e.g., parallel to the Y-axis). Each diagonal portion 84 may extend at a non-parallel, non-orthogonal angle relative to vertical portion 86. The diagonal portions may alternate extending to the right or left such that the signal line has a zig-zag shape. Consider the example of a signal path 82-1 starting at the top of FIG. 12. A first diagonal portion extends in the negative Y-direction and positive X-direction. A vertical portion then extends in the negative Y-direction. A second diagonal portion extends in the negative Y-direction and negative X-direction. A vertical portion then extends in the negative Y-direction. This pattern is repeated. The diagonal portions therefore alternate extending in the positive X-direction and negative X-direction. These signal lines may be referred to as extending vertically across the display (e.g., in the Y-direction) in a zig-zag pattern. These signal lines may be referred to as being non-linear across pixel removal region 332.

In FIGS. 8, 9, and 11, each signal line 82 provides signals to only pixels of a single color type. In FIG. 10, however, a signal line may provide signals to pixels of different colors. For example, the left-most signal line 82 in FIG. 10 may provide signals to blue and green thin-film transistor sub-pixels. The next (adjacent) signal line (in the positive X-direction) may provide signals to red and green thin-film transistor sub-pixels.

In FIG. 12, some of the signal lines provide signals to pixels of different colors. Signal line 82-1 provides signals to blue and red thin-film transistor sub-pixels. As shown in FIG. 12, starting at the top and moving in the negative Y-direction, signal line 82-1 provides signals to a red thin-film transistor sub-pixel 64R, then a blue thin-film transistor sub-pixel 64B, then a red thin-film transistor sub-pixel 64R, then a blue thin-film transistor sub-pixel 64B, etc. Every other signal line may have this type of arrangement.

The remaining signal lines have an arrangement such as signal line 82-2. Signal line 82-2 provides signals to only green thin-film transistor sub-pixels. Every other signal line may have this type of arrangement.

In FIG. 13, the emissive layer sub-pixels 62 and the thin-film transistor sub-pixels 64 have the same arrangement as in FIG. 11. However, the signal lines include both vertical portions (parallel to the Y-axis, sometimes referred to as vertical segments) and horizontal portions (parallel to the X-axis, sometimes referred to as horizontal segments). Each signal line 82 provides signals to thin-film transistor pixels of different colors. The left-most signal line 82 in FIG. 13 may provide signals to blue and green thin-film transistor sub-pixels. The next (adjacent) signal line may provide signals to red and green thin-film transistor sub-pixels. These signal lines may be referred to as being non-linear across pixel removal region 332.

Figure 14:
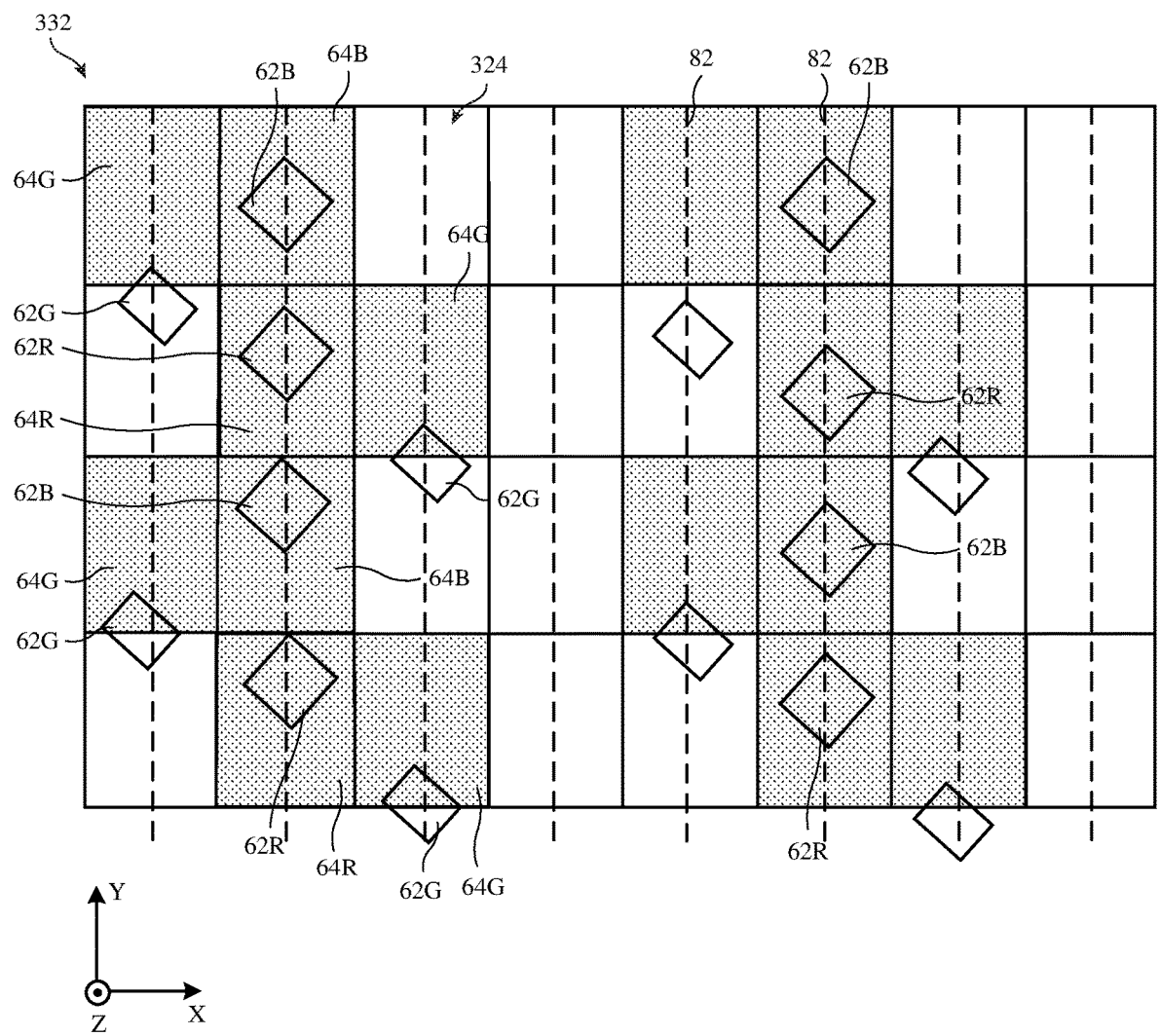
FIGS. 14-16 are top views of an illustrative display with emissive layer sub-pixels following a vertical zig-zag pixel pattern and various thin-film transistor patterns in accordance with an embodiment.
Figure 15:
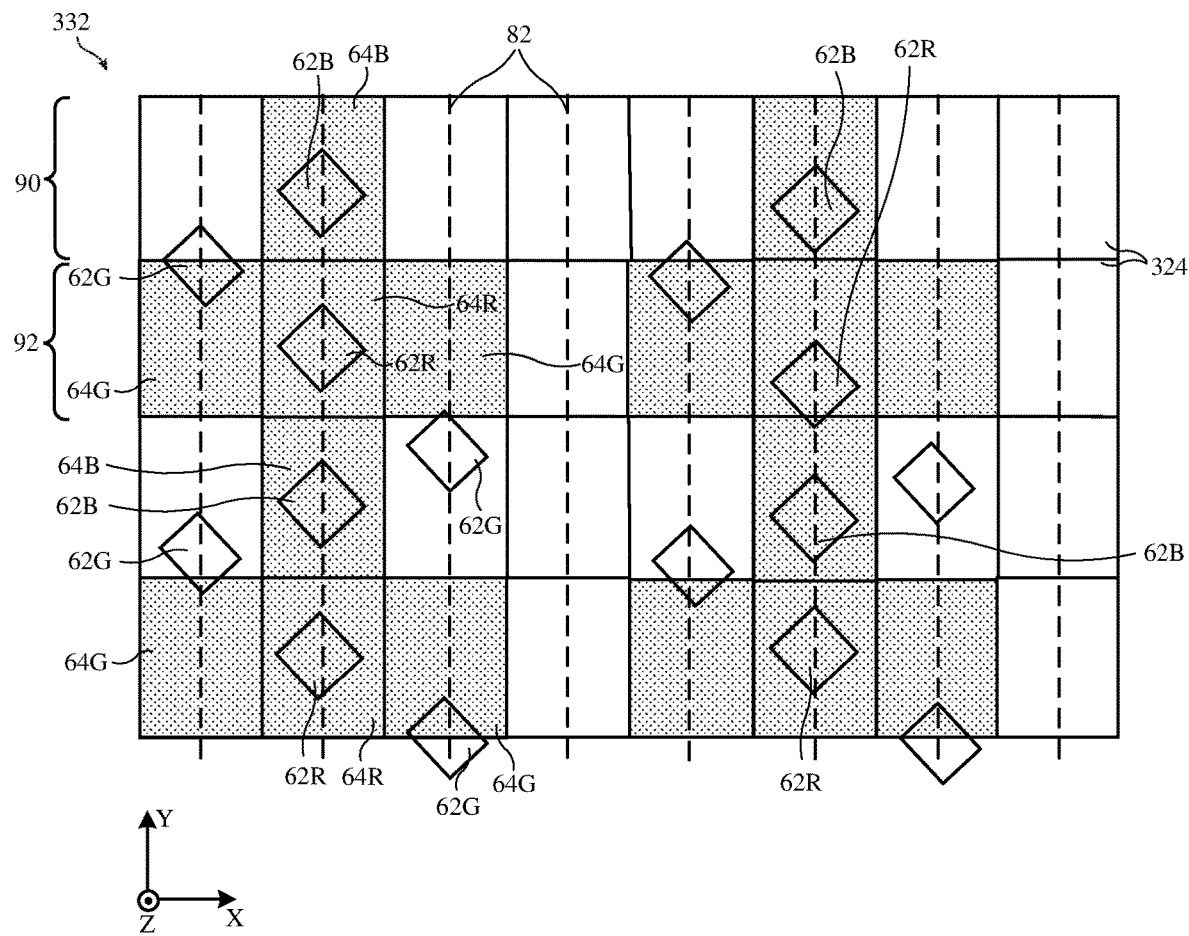
Figure 16:
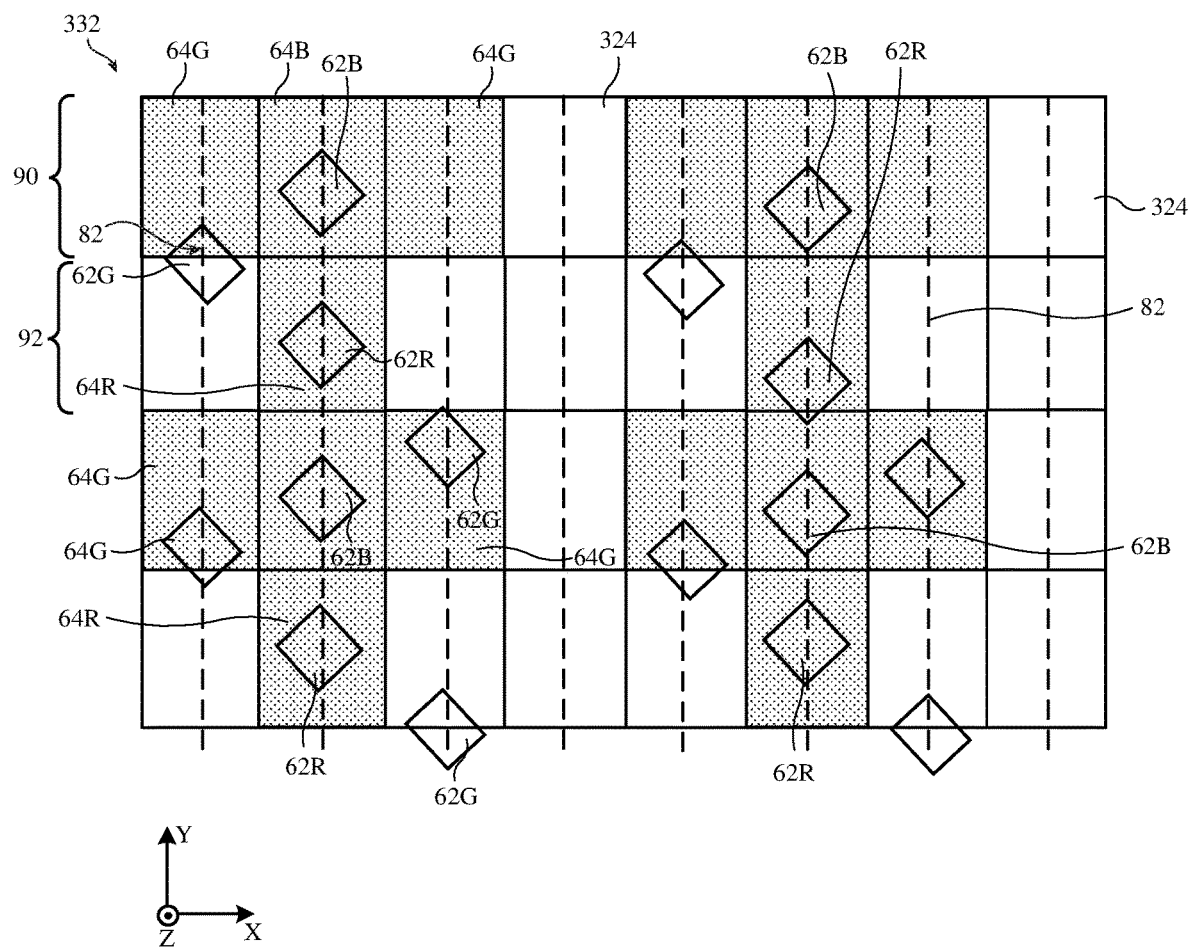

FIGS. 8-13 all include the same emissive layer sub-pixel pattern (e.g., a horizontal zig-zag pattern as in FIGS. 5 and 6). FIGS. 14-16 show a different emissive layer sub-pixel pattern (e.g., the vertical zig-zag pattern of FIG. 7). As shown in FIG. 14, emissive layer sub-pixels 62 extend in a zig-zag pattern vertically (e.g., in the Y-direction).

As shown in FIG. 14, each red emissive layer sub-pixel 62R has a corresponding red thin-film transistor sub-pixel 64R, each green emissive layer sub-pixel 62G has a corresponding green thin-film transistor sub-pixel 64G, and each blue emissive layer sub-pixel 62B has a corresponding blue thin-film transistor sub-pixel 64B. Each thin-film transistor sub-pixel controls the magnitude of light emitted from its corresponding emissive layer sub-pixel.

As shown in FIG. 14, transparent openings 324 are formed in the areas between thin-film transistor sub-pixels 64. In general, the emissive layer sub-pixels overlap the thin-film transistor sub-pixels. Therefore, the thin-film transistor sub-pixels primarily define the area for transparent openings 324 in pixel removal region 332. However, the thin-film transistor sub-pixels and emissive layer sub-pixels may optionally have partially or completely non-overlapping footprints.

In FIG. 14, every row includes a repeating pattern of two thin-film transistor sub-pixels 64 followed by two transparent openings 324. The two thin-film transistor sub-pixels of each row are shifted by one thin-film transistor sub-pixel relative to the above row, as shown in FIG. 14. Signal lines 82 extend vertically across the display.

This example is merely illustrative. In another embodiment, shown in FIG. 15, every other row (e.g., row 90) may have a repeating pattern of one thin-film transistor sub-pixel and three transparent openings 324. Row 90 includes a blue thin-film transistor sub-pixel 64B as the one thin-film transistor sub-pixel in the pattern. Every other row (e.g., row 92) may have a repeating pattern of three thin-film transistor sub-pixels and one transparent opening 324. Row 92 includes a green thin-film transistor sub-pixel, a red thin-film transistor sub-pixel, then one green thin-film transistor sub-pixel in the repeating pattern.

In another embodiment, shown in FIG. 16, every other row (e.g., row 90) may have a repeating pattern of three thin-film transistor sub-pixels and one transparent opening 324. Row 90 includes one green thin-film transistor sub-pixel, one blue thin-film transistor sub-pixel, then one green thin-film transistor sub-pixel in the repeating pattern. Every other row (e.g., row 92) may have a repeating pattern of one thin-film transistor sub-pixel and three transparent openings 324. Row 92 includes a red thin-film transistor sub-pixel 64R as the one thin-film transistor sub-pixel in the pattern.

Figure 17:
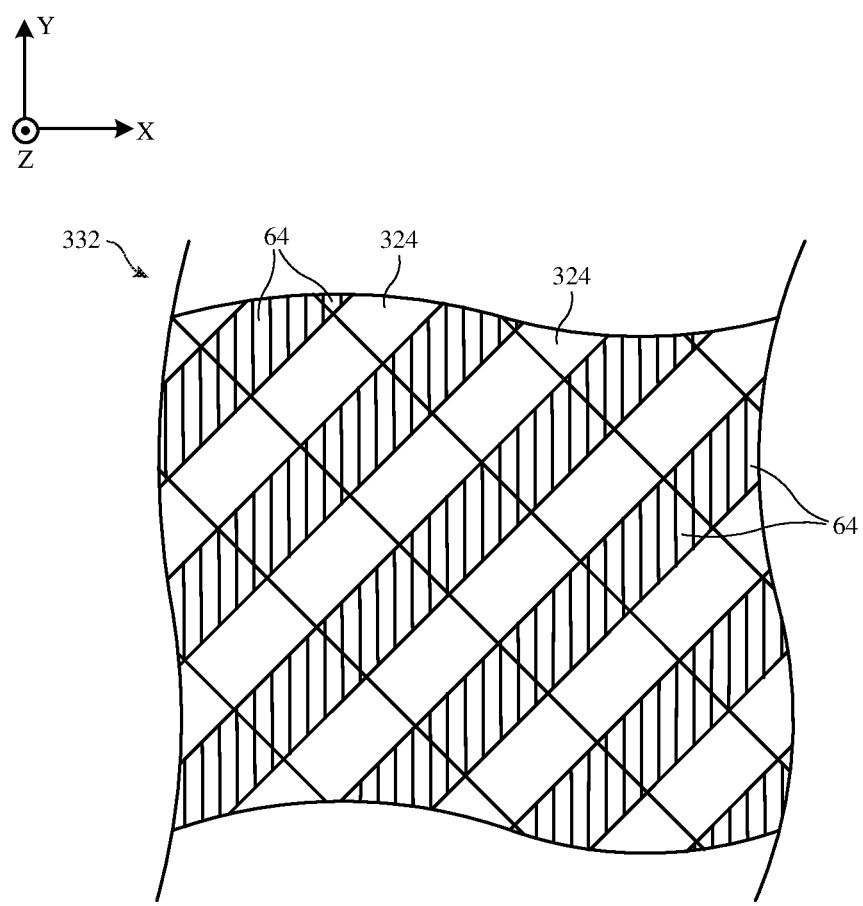
FIG. 17 is a top view of an illustrative display having diagonal strips of thin-film transistor sub-pixels in accordance with an embodiment.

In another possible embodiment, shown in FIG. 17, thin-film transistor sub-pixels 64 may extend diagonally across the display. In FIG. 17, the display edge may be parallel to the X axis or the Y axis. The front face of the display may be parallel to the XY plane such that a user of the device views the front face of the display in the Z direction. Strips of thin-film transistor sub-pixels 64 may extend diagonally across the display in pixel removal region 332. The strips of thin-film transistor sub-pixels may be at non-parallel, non-orthogonal angles relative to the X-axis and the Y-axis. The transparent openings 324 between thin-film transistor sub-pixels therefore also extend at non-parallel, non-orthogonal angles relative to the X-axis and the Y-axis. The diagonal thin-film transistor sub-pixel arrangement of FIG. 17 may be used in combination with any emissive layer sub-pixel arrangement (e.g. horizontal zig-zags as in FIGS. 8-13, vertical zig-zags as in FIGS. 14-16, etc.) and any signal line arrangement (e.g., signal lines of the type in FIGS. 8-11, signal lines of the type in FIG. 12, signal lines of the type in FIG. 13, entirely diagonal signal lines, etc.).

In FIG. 17, the diagonal strips extend from the lower-left to the upper-right across the pixel removal region. In another possible embodiment, the diagonal strips may extend from the lower-right to the upper-left across the pixel removal region. Different pixel removal regions may optionally have different (e.g., orthogonal) diagonal thin-film transistor sub-pixel patterns.

Figure 18A:
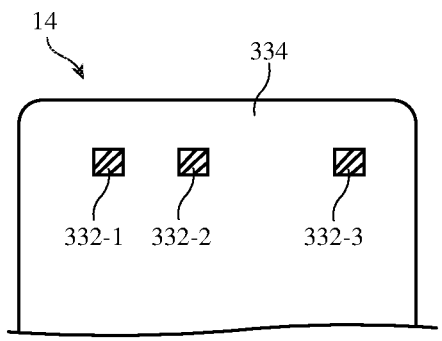
FIGS. 18A-18F are top views of illustrative displays showing possible positions for pixel removal regions in accordance with an embodiment.

In general, the display subpixels may be partially removed from any region(s) of display 14. FIGS. 18A-18F are front views showing how display 14 may have one or more localized pixel removal regions in which the pixels are selectively removed. The example of FIG. 18A illustrates various local pixel removal regions 332 physically separated from one another (i.e., the various pixel removal regions 332 are non-continuous) by full pixel density region 334. The full pixel density region 334 does not include any transparent windows 324 (e.g., none of the sub-pixels are removed and the display follows the pixel pattern without modifications). The three pixel removal regions 332-1, 332-2, and 332-3 in FIG. 18A might for example correspond to three different sensors formed underneath display 14 (with one sensor per pixel removal region).

Figure 18B:
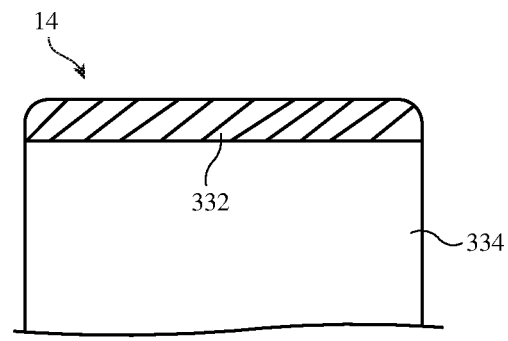
Figure 18C:
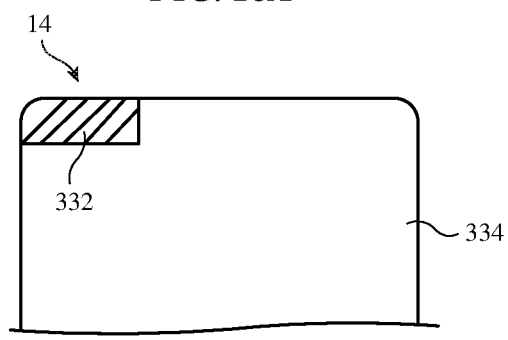
Figure 18D:
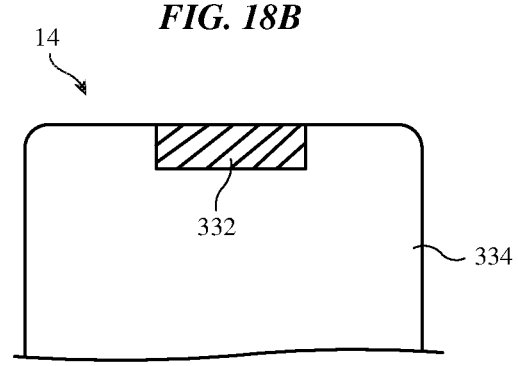
Figure 18E:
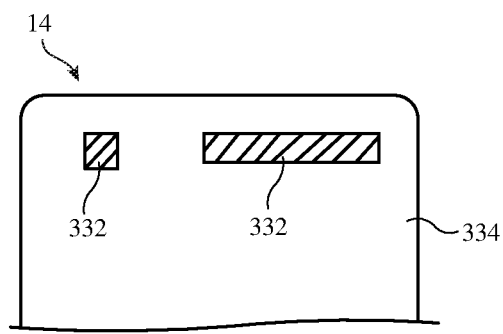
Figure 18F:
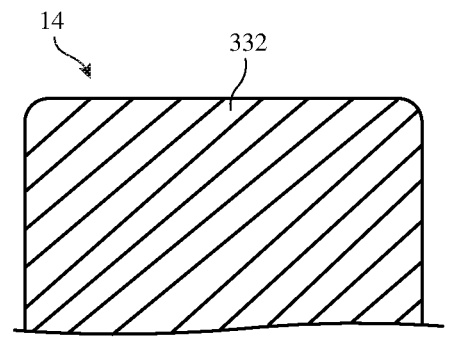

The example of FIG. 18B illustrates a continuous pixel removal region 332 formed along the top border of display 14, which might be suitable when there are many optical sensors positioned near the top edge of device 10. The example of FIG. 18C illustrates a pixel removal region 332 formed at a corner of display 14 (e.g., a rounded corner area of the display). In some arrangements, the corner of display 14 in which pixel removal region 332 is located may be a rounded corner (as in FIG. 18C) or a corner having a substantially 90° corner. The example of FIG. 18D illustrates a pixel removal region 332 formed only in the center portion along the top edge of device 10 (i.e., the pixel removal region covers a recessed notch area in the display). FIG. 18E illustrates another example in which pixel removal regions 332 can have different shapes and sizes. FIG. 18F illustrates yet another suitable example in which the pixel removal region covers the entire display surface. These examples are merely illustrative and are not intended to limit the scope of the present embodiments. If desired, any one or more portions of the display overlapping with optically based sensors or other sub-display electrical components may be designated as a pixel removal region/area.

Different pixel removal regions in the display may have different designs to mitigate diffractive artifacts. This principle is illustrated in FIGS. 19A-19C. In particular, consider the example of a point light source that is captured by sensor 13 through display 14. When the sensor captures an image of the point light source through the display, the point light source should (ideally) appear as a circular area of light in an image captured by sensor 13 through the display. FIG. 19A shows an example of this type, with the light from the point source appearing over area 96 in image 94 that is captured through the pixel removal region of the display. In FIG. 19A (e.g., in an ideal scenario where no diffraction artifacts are present), area 96 has a circular shape without additional spikes or rainbow effects. In practice, the periodic nature of the transparent openings in pixel removal region 332 may result in area 96 having an appearance as shown in FIG. 19B or FIG. 19C.

For example, a pixel removal region 332 of the type shown in FIG. 9 may produce a diffraction spike as shown in FIG. 19B. As shown, area 96 in FIG. 19B includes vertical spike portions 96-V in addition to a circular portion. Vertical spike portions 96-V are undesirable artifacts that compromise the quality of the image data captured by sensor 13 through pixel removal region 332. To mitigate the diffractive artifacts, the periodicity of the transparent openings may optionally be reduced. However, design constraints for the display may result in some diffractive artifacts still being associated with pixel removal region 332.

Instead of entirely eliminating diffractive artifacts for a given pixel removal region, a different pixel removal region may be provided with a different design that has different diffractive artifacts. For example, a pixel removal region 332 of the type shown in FIG. 10 may produce a diffraction spike as shown in FIG. 19C. Area 96 in FIG. 19C includes horizontal spike portions 96-H in addition to a circular portion. The artifact in FIG. 19C is different than the artifact in FIG. 19B. Therefore, images from respective sensors under respective pixel removal regions having different designs (with different associated diffractive artifacts) may be used in parallel to obtain an artifact free image.

Figure 20:
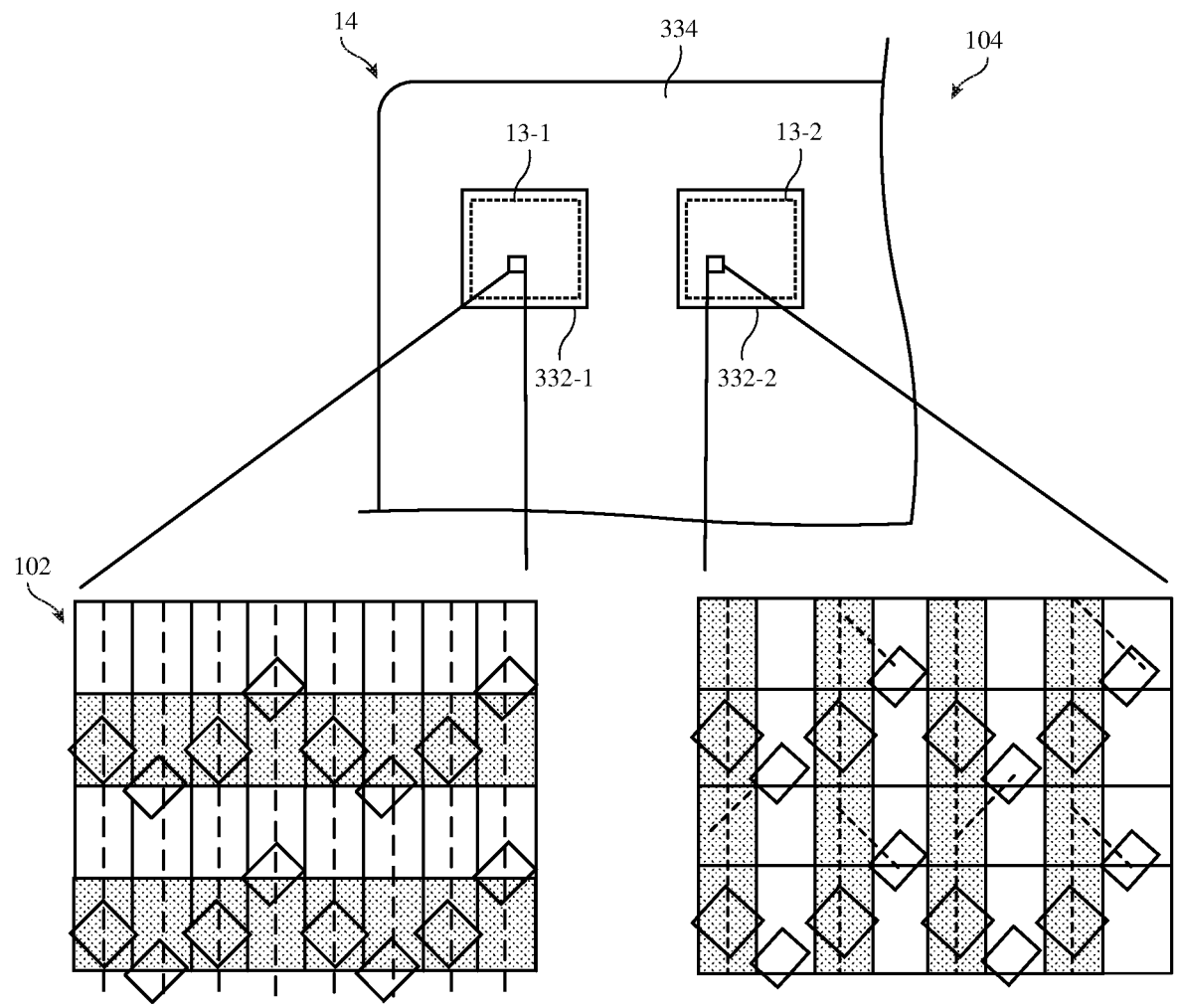
FIG. 20 is a top view of an illustrative display having first and second pixel removal regions with different patterns in accordance with an embodiment.

FIG. 20 shows how different pixel removal regions may have different designs. As shown in FIG. 20, display 14 includes a first pixel removal region 332-1 over a first sensor 13-1. Each pixel removal region is laterally surrounded by full pixel density region 334 and a portion of full pixel density region 334 is interposed between the first and second pixel removal regions.

Pixel removal region 332-1 has a first design, as shown by inset portion 102. Display 14 also includes a second pixel removal region 332-2 over a second sensor 13-2. Pixel removal region 332-2 has a different design, as shown by inset portion 104. Because pixel removal portions 332-1 and 332-2 have different designs, the images obtained by sensors 13-1 and 13-2 will have different associated diffractive artifacts. The images from 13-1 and 13-2 may therefore be combined (e.g., by control circuitry in the device) to produce an artifact-free image. In other words, the image data from sensor 13-1 may be used to replace the artifact-compromised portion of the image from sensor 13-2. The image data from sensor 13-2 may be used to replace the artifact-compromised portion of the image from sensor 13-1. The resulting image may be artifact-free.

In FIG. 20, pixel removal region 332-1 uses the design of FIG. 9 and pixel removal region 332-2 uses the design of FIG. 10. This example is merely illustrative. In general, each pixel removal region may use any desired design. Each pixel removal region may have a emissive layer sub-pixel pattern (e.g., horizontal zig-zags as in FIGS. 8-13, vertical zig-zags as in FIGS. 14-16), a thin-film transistor sub-pixel pattern (e.g., as in FIG. 8, as in FIGS. 9 and 12, as in FIG. 10, as in FIGS. 11 and 13, as in FIG. 14, as in FIG. 15, as in FIG. 16, as in FIG. 17, etc.), and a signal line pattern (e.g., vertical signal lines as in FIG. 8, 9, 11, or 14-16, vertical signal lines as in FIG. 10, zig-zag signal lines as in FIG. 12, non-linear signal lines as in FIG. 13, etc.). Any of these emissive layer sub-pixel, thin-film transistor sub-pixel, and signal line patterns may be used in any combination to form the overall pattern for a given pixel removal region.

One or more of the emissive layer sub-pixel, thin-film transistor sub-pixel, and signal line patterns may be varied between pixel removal regions in FIG. 20. For example, pixel removal region 332-1 may use a first emissive layer sub-pixel pattern and pixel removal region 332-2 may use a second, different emissive layer sub-pixel pattern (e.g., horizontal vs. vertical zig-zag patterns). Pixel removal region 332-1 may use a first thin-film transistor sub-pixel pattern and pixel removal region 332-2 may use a second, different thin-film transistor sub-pixel pattern (e.g., horizontal strips vs. vertical strips as in FIG. 20, horizontal strips vs. diagonal strips, diagonal strips extending a first direction vs. diagonal strips extending in a second, orthogonal direction, etc.). Pixel removal region 332-1 may use a first signal line pattern and pixel removal region 332-2 may use a second, different signal line pattern (e.g., vertical signal lines vs. zig-zag pixel lines).

In general, any design may be used for each of pixel removal regions 332-1 and 332-2 in FIG. 20, with at least one differing pattern between the two pixel removal regions. This mitigates diffractive artifacts in the images obtained by the sensors.

It should be noted that in some cases, multiple sensors may be covered by a single pixel removal region without any intervening full pixel density portion of the display (e.g., as in FIG. 18B). In these types of embodiments, the pixel removal region may still have different designs over respective sensors to mitigate diffractive artifacts.

Figure 21:
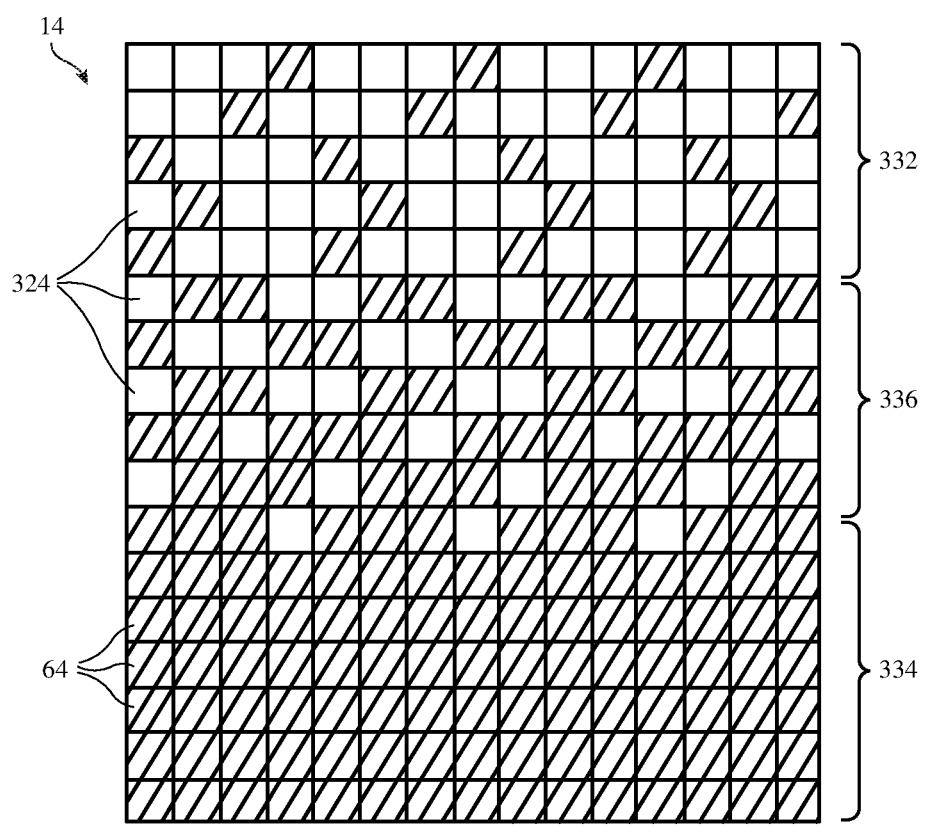
FIG. 21 is a top view of an illustrative display having a transition region between a pixel removal region and a full pixel density region in accordance with an embodiment.

In one possible embodiment, there may be a strict boundary between the pixel removal regions 332 and the surrounding full pixel density region 334 of the display. Alternatively, there may be a gradual transition between the full pixel density of region 334 and the decreased pixel density of pixel removal region 332. FIG. 21 is a top view of a display with a transition region between regions 332 and 334.

As shown in FIG. 21, display 14 includes thin-film transistor sub-pixels 64 (which are opaque or nearly opaque) and transparent openings 324 (which have a higher transparency than thin-film transistor sub-pixels 64). The display 14 may also include emissive layer sub-pixels and signal lines in any desired pattern. As shown, full pixel density portion 334 of the display includes thin-film transistor sub-pixels 64 and no transparent openings. Pixel removal region 332 includes some thin-film transistor sub-pixels 64 and some transparent openings 324. Specifically, in FIG. 21 pixel removal region 332 includes 3 transparent openings for each thin-film transparent sub-pixel.

The display in FIG. 21 also includes a transition region 336 between pixel removal region 332 and full pixel density portion 334. In transition region 336 the ratio of thin-film transistor sub-pixels to transparent openings gradually decreases from region 334 to region 332. In other words, the pixel density gradually changes from a maximum density in region 334 to a minimum density in region 332.

Figure 22:
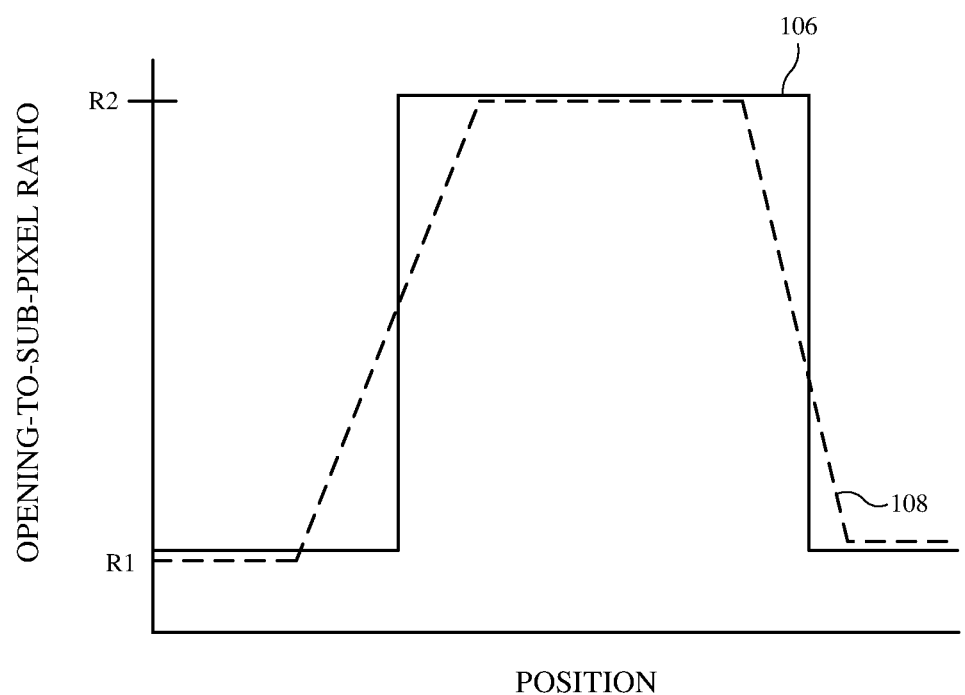
FIG. 22 is a graph of illustrative profiles for a ratio of transparent openings to thin-film transistor sub-pixels versus position across the display in accordance with an embodiment.

FIG. 22 is a graph showing how a transition region may optionally be included in the display. FIG. 22 shows the ratio of transparent openings to thin-film transistor sub-pixels in the display as a function of position across the display (e.g., across an entire pixel removal region 332). The ratio may sometimes have a first profile 106 across the display that follows a step function. In this example, the ratio has a minimum value $R_1$ (e.g., 0) in the full pixel density region 334 where there are no transparent openings. The ratio has a maximum value $R_2$ (e.g., 3:1 in FIG. 21) in the pixel removal region 332. In profile 106, there is a step change between $R_1$ and $R_2$ without any intermediate values.

Alternatively, profile 108 may be used that includes at least one intermediate value between $R_1$ and $R_2$. Profile 108 thereby illustrates how a transition region with intermediate pixel density may be used between the full pixel density region 334 and the pixel removal region 332. In FIG. 22, there is a gradual change on both sides of the pixel removal region in profile 108. This example is merely illustrative. The pixel removal region may have a gradual transition on some but not all sides if desired.

The ratio of openings to sub-pixels may be inversely related to the pixel density. In other words, the pixel density may be at a maximum when the ratio of openings to sub-pixels is at its minimum $R_1$. Similarly, the pixel density may be at a minimum when the ratio of openings to sub-pixels is at its maximum $R_2$. The pixel density may follow a step change (as in profile 106) or may change gradually with at least one intermediate value (as in profile 108).

Figure 23:
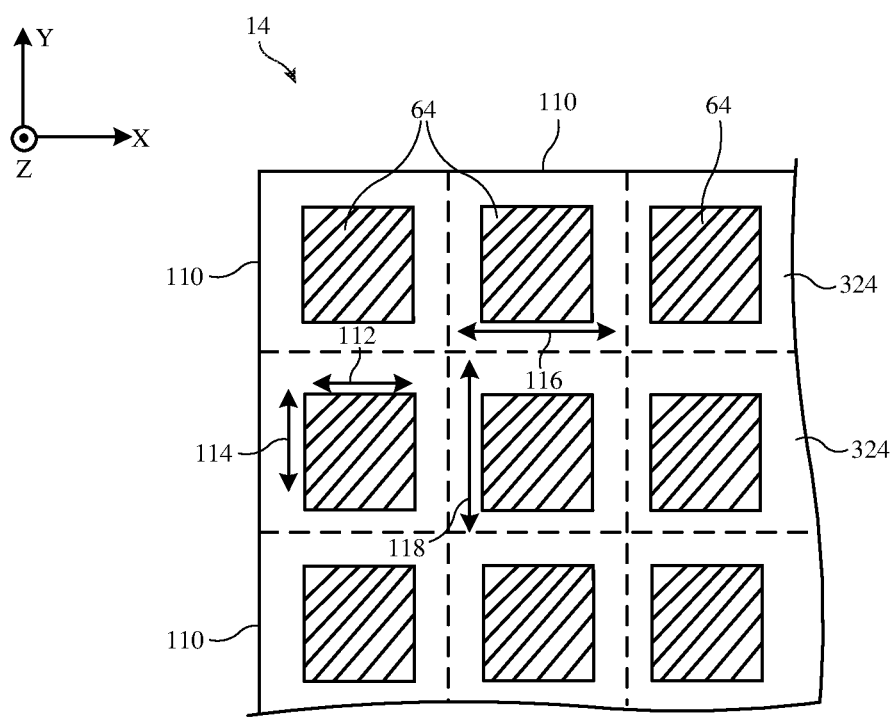
FIG. 23 is a top view of an illustrative display having a pixel area and a corresponding smaller thin-film transistor sub-pixel for each sub-pixel in accordance with an embodiment.

FIG. 23 shows yet another example for increasing transparency through a display. In FIG. 23, each thin-film transistor sub-pixel has an area that is smaller than the overall area 110 dedicated to that thin-film transistor sub-pixel. Each thin-film transistor sub-pixel 64 has a width 112 and a height 114. Each pixel area 110 has a width 116 and a height 118. Width 116 may be greater than width 112 by any desired amount (e.g., more than 10%, more than 20%, more than 30%, more than 40%, more than 50%, more than 70%, more than 100%, etc.). Height 118 may be greater than height 114 by any desired amount (e.g., more than 10%, more than 20%, more than 30%, more than 40%, more than 50%, more than 70%, more than 100%, etc.). The total area of each thin-film transistor sub-pixel may be less than the total area of each pixel area 110. The total area of pixel area 110 may be greater than the area of thin-film transistor sub-pixel 64 by any desired amount (e.g., more than 10%, more than 20%, more than 30%, more than 40%, more than 50%, more than 70%, more than 100%, etc.).

Because each thin-film transistor is smaller than its corresponding area 110, a percentage of each pixel area 110 forms a transparent opening 324 (e.g., an area with a higher transparency than thin-film transistor sub-pixel 64). The percentage of each pixel area occupied by transparent opening 324 may be more than 10%, more than 20%, more than 30%, more than 40%, more than 50%, more than 70%, less than 50%, between 30% and 50%, etc.

Width 116 and height 118 may be less than 100 microns, less than 80 microns, less than 50 microns, less than 30 microns, greater than 10 microns, greater than 30 microns, greater than 50 microns, greater than 80 microns, or any other desired distance.

The arrangement of FIG. 23 allows for light to be transmitted through the display to an underlying sensor. Pixels may have the arrangement of FIG. 23 in an isolated portion of the display (e.g., a low pixel density region 332) or across the entire display.

Because one or more sensors 13 are positioned behind the display, it may be desirable to reduce back emission within the display. Back emission may refer to light that is emitted or reflected in the negative Z-direction (e.g., away from the viewer and towards a sensor behind the display).

Figure 24:
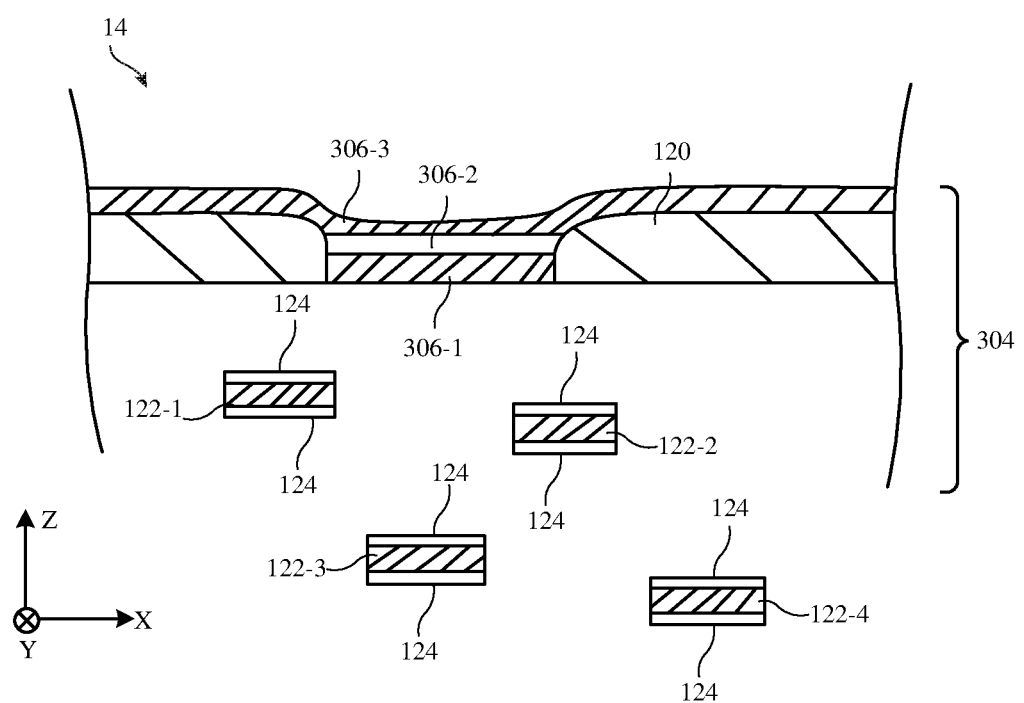
FIG. 24 is cross-sectional side view of an illustrative thin-film transistor layer having a black pixel definition layer and light absorbing coatings on conductive layers in accordance with an embodiment.

FIG. 24 is a cross-sectional side view of an illustrative thin-film transistor layer with reduced back emission. In thin-film transistor layer 304, the display may include a pixel formed from emissive material 306-2 that is interposed between an anode 306-1 and a cathode 306-3. Signals may be selectively applied to anode 306-1 to cause emissive material 306-2 to emit light for the pixel. Circuitry in thin-film transistor layer 304 may be used to control the signals applied to anode 306-1.

A pixel definition layer 120 may be used to define an area for the pixel. As shown in FIG. 24, anode 306-1 and emissive layer 306-2 may be formed in an opening defined by pixel definition layer 120. To mitigate back emission in the display (e.g., light directed in the negative Z-direction), pixel definition layer (PDL) 120 may include a light absorbing material. The pixel definition layer may be formed from a black (light absorbing) material or may be formed from a base material and an additional black (light absorbing) additive to increase light absorption. Pixel definition layer 120 may absorb any desired amount of light (e.g., more than 50% of light, more than 60% of light, more than 70% of light, more than 80% of light, more than 90% of light, more than 95% of light, etc.) at visible and/or infrared wavelengths. Forming pixel definition layer 120 in this manner may reduce the amount of light emitted by the display pixels that ends up being sensed by sensor 13. The light absorbing pixel definition layer may be omitted in transparent window regions 324 of the display.

The thin-film transistor layer 304 may include additional conductive layers 122. The conductive layers may include conductive layer 122-1, conductive layer 122-2, conductive layer 122-3, and conductive layer 122-4. The conductive layers may be used by thin-film transistor circuitry to supply and receive signals. For example, conductive layer 122-1 may form a first source-drain metal layer (e.g., that forms a source terminal or drain terminal for a transistor that applies signals to anode 306-1). Conductive layer 122-2 may form a second source-drain metal layer (e.g., that forms a source terminal or drain terminal for a transistor that applies signals to anode 306-1). Conductive layer 122-3 may form a first gate metal layer (e.g., that forms a gate line, a data line, power supply line, or other signal line for the display). Conductive layer 122-4 may form a second gate metal layer (e.g., that forms a gate line, a data line, power supply line, or other signal line for the display). Conductive layers 122-1, 122-2, 122-3, and 122-4 may optionally be formed in different planes of the thin-film transistor layer 304.

To mitigate back emission, each conductive layer may have a light absorbing layer 124 on its upper and/or lower surface. In FIG. 24, each one of conductive layers 122-1, 122-2, 122-3, and 122-4 includes a light absorbing layer 124 on its upper and lower surface. The light absorbing layer may be formed from any desired light absorbing material. The light absorbing material may be conductive (e.g., metal) or may be dielectric (e.g., an insulating polymer). Each light absorbing layer 124 may absorb any desired amount of light (e.g., more than 50% of light, more than 60% of light, more than 70% of light, more than 80% of light, more than 90% of light, more than 95% of light, etc.) at visible and/or infrared wavelengths. Forming light absorbing layers 124 in this manner may reduce the amount of light emitted by the display pixels that ends up being sensed by sensor 13.

As another possible example, a blanket light absorbing layer may be formed in some portion of thin-film transistor layer 304 (e.g., interposed between adjacent insulating/buffer layers within the thin-film transistor layer) instead of coated directly on a conductive layer 122.

Figure 25:
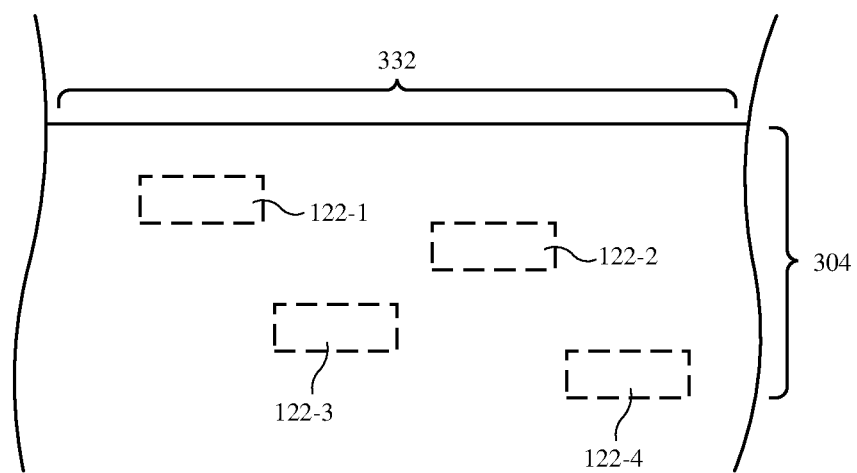
FIG. 25 is cross-sectional side view of an illustrative thin-film transistor layer having transparent conductive layers in a pixel removal region in accordance with an embodiment.

FIG. 25 is a cross-sectional side view of thin-film transistor layer 304 in a pixel removal region 332 of the display. As shown, one or more conductive layers 122-1, 122-2, 122-3, and 122-4 may still be included in the pixel removal region (e.g., to provide signals to the pixels still present in the pixel removal region). However, one or more of conductive layers 122-1, 122-2, 122-3, and 122-4 may be formed from a transparent material. Forming the conductive layers from a transparent material prevents the conductive layers from blocking light that would otherwise reach the underlying sensor 13. This therefore improves the efficiency of the sensor.

Conductive layers 122 may be formed from any desired transparent material (e.g., indium tin oxide, doped semiconductor oxide such as indium gallium zinc oxide (IGZO), doped polysilicon, etc.). Each conductive transparent layer may transmit any desired amount of light (e.g., more than 50% of light, more than 60% of light, more than 70% of light, more than 80% of light, more than 90% of light, more than 95% of light, etc.) at visible and/or infrared wavelengths.

Figure 26:
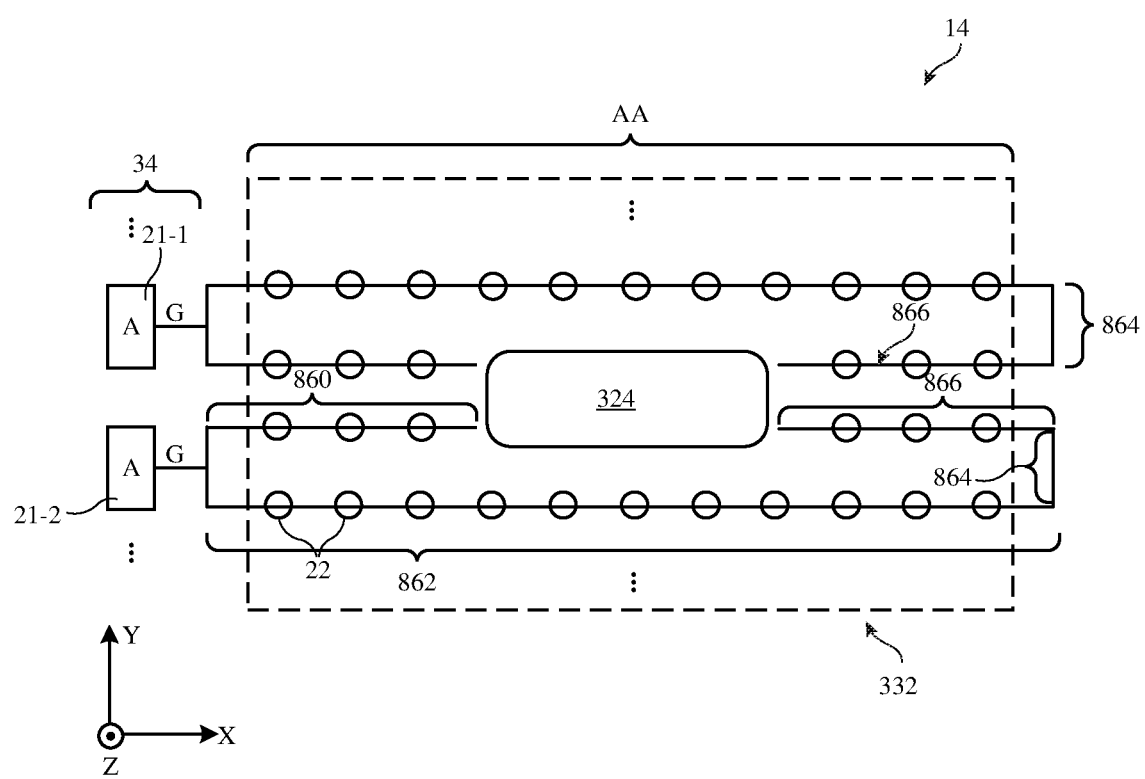
FIG. 26 is a top view of illustrative display circuitry showing how multi-row single-sided gate driver circuits may be configured to drive corresponding gate lines at least some of which are looped back to drive pixels that would otherwise be unreachable due to a transparent window in the active area in accordance with an embodiment.

Additional accommodations may be made to route signal lines around the transparent openings 324 of the display. FIG. 26 shows an arrangement of display 14 having multi-row single-sided gate drivers that are used to drive gate lines in the vicinity of a transparent opening within the active area when viewed from the front of the display surface in direction Z towards the X-Y plane. In a multi-row single sided gate driver, a single peripheral driver circuit may be configured to generate a corresponding control signal A (e.g., a scan signal, an emission signal, an initialization signal, a reference signal, a reset signal, an enable signal, a row control signal, a column control signal, etc.) simultaneously onto more than two control lines (e.g., two or more row control lines in adjacent/consecutive rows, two or more row control lines in non-adjacent/non-consecutive rows, etc.).

As shown in FIG. 26, gate driver 21-1 may be configured to output a first gate signal (A) that is fed to a first row of pixels that extend across the entirety of the active area AA without being obstructed by transparent window 324 and that is also fed to a second row of pixels, a first portion of which lies on the left side of transparent window 324 and a second portion of which lies on the right side of transparent window 324. Similarly, gate driver 21-2 may be configured to output a second gate signal (A) that is fed to a third row of pixels, a first portion of which lies on the left side of transparent window 324 and a second portion of which lies on the right side of transparent window 324, and that is also fed to a fourth row of pixels that extend across the entirety of the active area AA without being obstructed by transparent window 324. The gate signals (A) provided by gate drivers 21-1 and 21-2 may be scan control signals provided to switching transistors, emission control signals provided to emission transistors, an initialization signal, a reference signal, a reset signal, an enable signal, a row control signal, a column control signal, or other desired control signals.

The first gate signal output from gate driver 21-1 may be fed to all of the display pixels in the first row via a first linear gate segment 862 that extends across the entirety of the active area (i.e., first gate line 862 extends across an entire width of the active area). The first gate signal output from gate driver 21-1 may also be fed to the first portion of pixels to the left of transparent window 324 within the second pixel row via a first linear gate segment 860 that extends from gate driver 21-1 and terminates at the left edge (border) of transparent window 324. In order for the first gate signal to be conveyed to the second portion of pixels to the right of transparent window 324 in the second row, the first gate segment 862 may be coupled to a first gate segment 866 feeding those pixels via a first loopback connecting segment 864. First loopback segment 864 may be perpendicular or otherwise angled with respect to segments 862 and 866. Segment 866 may extend from the right edge of active area AA to the right edge (border) of transparent window 324.

Similarly, the second gate signal output from gate driver 21-2 may be fed to all of the display pixels in the fourth row via a second linear gate segment 862 that extends across the entirety of the active area (i.e., second gate line 862 extends across an entire width of the active area). The second gate signal output from gate driver 21-2 may also be fed to the first portion of pixels to the left of transparent window 324 within the third pixel row via a second linear gate segment 860 that extends from gate driver 21-2 and terminates at the left edge (border) of transparent window 324. In order for the second gate signal to be conveyed to the second portion of pixels to the right of transparent window 324 in the third row, the second gate segment 862 may be coupled to a second gate segment 866 feeding those pixels via a second loopback connecting segment 864. Segment 866 may extend from the right edge of active area AA to the right edge (border) of transparent window 324. In the example of FIG.

26, loopback connections 864 are made outside the active area AA. Alternatively, loopback connection 864 may instead be made inside the active area AA.

Multiple gate driver circuits having the same configuration as drivers 21-1 and 21-2 may be included in the gate driver circuitry 34. Each driver may be used to provide a corresponding control signal to the pixels and may include loopback connections as shown in FIG. 26. Gate driver circuits having the same configuration as drivers 21-1 and 21-2 may also (instead or in addition) be positioned on the right side of the active area, with loopback connecting segments on the left side of the area (e.g., the opposite arrangement of FIG. 26).

It should be noted that the example in FIG. 26 of transparent window 324 interrupting two adjacent rows is merely illustrative. In another embodiment, every other row of pixels may include a transparent window 324 (e.g., as shown in FIG. 6). A similar loopback scheme may still be used in this type of arrangement, with each pair of rows including one continuous gate line and one loopback gate line scheme to provide signals to both sides of the transparent window. All of the rows of pixels in the pixel removal region 332 may include this type of gate line routing scheme.

In FIG. 26, the gate driver circuitry 34 includes multi-row single-sided gate drivers 21 that are each used to provide a control signal (A) to gate lines for adjacent rows of pixels in the display. This type of arrangement may result in luminance variations between rows.

Figure 27A:
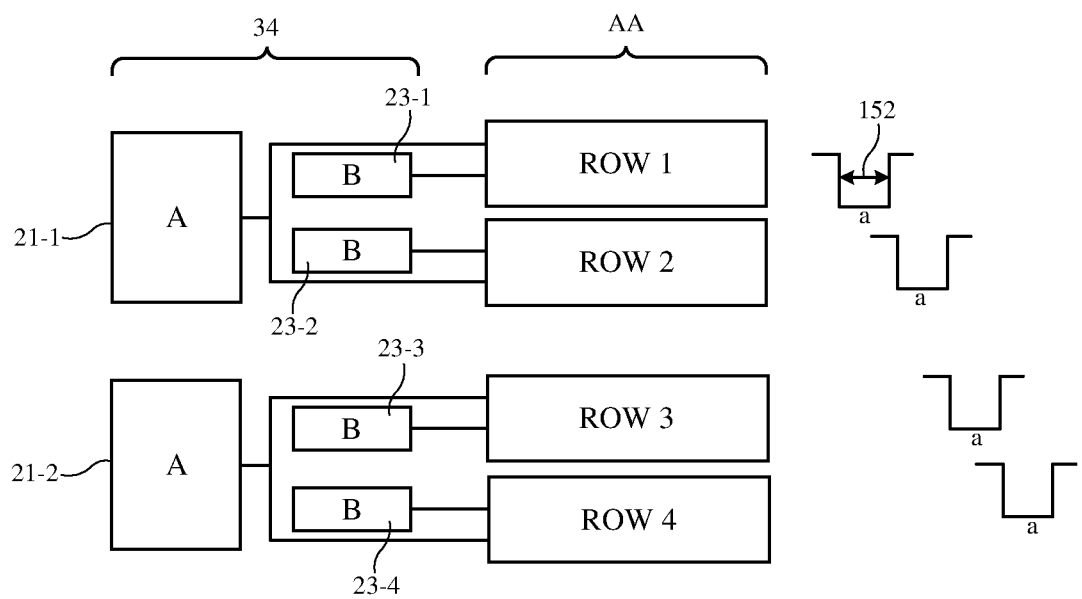
FIGS. 27A and 27B show illustrative gate driving circuitry having a uniform pulse scheme and corresponding row-to-row luminance variations in accordance with an embodiment.

FIG. 27A is a schematic diagram showing how gate driver circuitry 34 may also include single-row single-sided gate drivers 23 that are used to provide a control signal B to gate lines for rows of pixels in the display. Unlike drivers 21 (which are each shared between two rows of pixels), each gate driver 23 has a corresponding single row of pixels. Gate driver 23-1 may provide a control signal to the first row of pixels (row 1), gate driver 23-2 may provide a control signal to the second row of pixels (row 2), gate driver 23-3 may provide a control signal to the third row of pixels (row 3), and gate driver 23-4 may provide a control signal to the fourth row of pixels (row 4). Each gate driver 23 may provide a control signal B (e.g., a scan signal, an emission signal, an initialization signal, a reference signal, a reset signal, an enable signal, a row control signal, a column control signal, etc.) on a corresponding gate line to its respective row of pixels.

The presence of multi-row drivers 21 may result in luminance variations between rows. In the example of FIG. 27A, control signal B has the same pulse length and shape for each row of pixels. As shown, the control signal may have a corresponding pulse 'a' for each row of pixels. Pulse 'a' may involve the signal being pulsed for a length of time 152 (sometimes referred to as a duration or on-period). Each row may all receive the same pulse 'a' in sequence from the gate drivers 23.

Figure 27B:
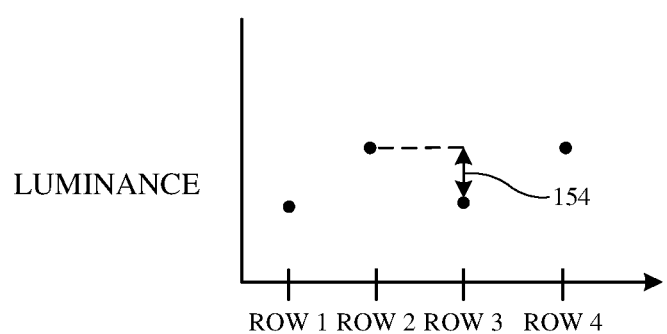

However, this may result in varying luminance, as shown in FIG. 27B. FIG. 27B is a graph of luminance for the pixel rows when using the pulse scheme of FIG. 27A. As shown, the first and third pixel rows have a lower luminance that the second and fourth pixel rows (e.g., the luminance may differ by magnitude 154). The varying luminance between alternating rows may be an artifact of the multi-row gate drivers 21.

Figure 28A:
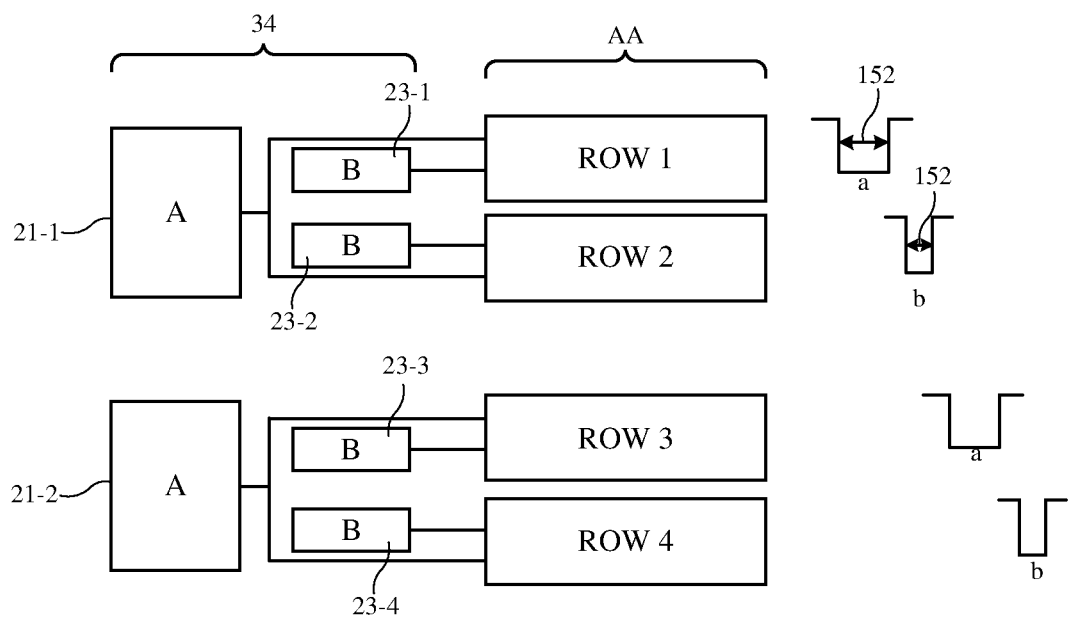
FIGS. 28A and 28B show illustrative gate driving circuitry having an alternating pulse scheme and corresponding mitigated row-to-row luminance variations in accordance with an embodiment.

To mitigate luminance variation between pixel rows in displays with multi-row gate drivers, different control signal pulse schemes may be used for different pixels. As shown in FIG. 28A, control signal B has different pulse lengths for alternating rows of pixels. As shown, the control signal may have a corresponding pulse 'a' for each odd numbered row of pixels (e.g., row 1, row 3, etc.). The control signal may have a corresponding pulse 'b' for each even numbered row of pixels (e.g., row 2, row 4, etc.). Pulse 'a' may involve the signal being pulsed for a length of time 152. Pulse 'b' may involve the signal being pulsed for a length of time 156 that is different than (e.g., greater than or less than) length of time 152. Each odd row may receive a pulse 'a' whereas each even row may receive a pulse 'b.'

Figure 28B:
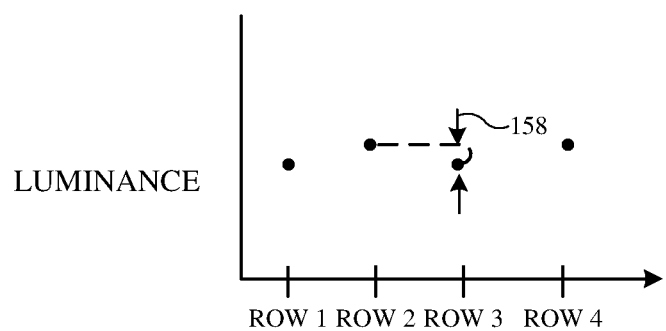

FIG. 28B is a graph of luminance for the pixel rows when using the pulse scheme of FIG. 28A. As shown, adjacent rows have a luminance difference 158 that is reduced (or eliminated) compared to the luminance difference 154 in FIG. 27B. Different pulse times for alternating rows may therefore be used to tune the luminance of the pixels and reduce luminance variations between alternating rows.

Pixel rows in a pixel removal region of the display (e.g., pixel removal region 332) may have different row-to-row luminance behavior than pixel rows in a full pixel density region (e.g., full pixel density region 334) due to different thin-film transistor loading in each row. Accordingly, a fixed pulse timing scheme across the whole display may result in undesirably high luminance variations within the pixel removal region.

Figure 29A:
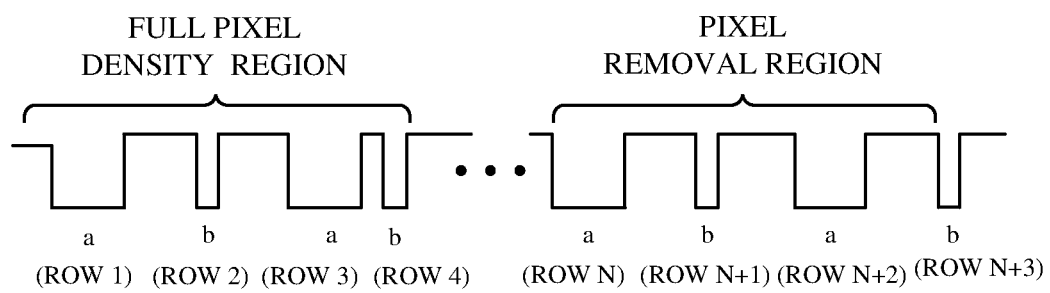
FIGS. 29A and 29B show an illustrative pulse scheme that is the same in the full pixel density region as in the pixel removal region and corresponding row-to-row luminance variations in accordance with an embodiment.
Figure 29B:
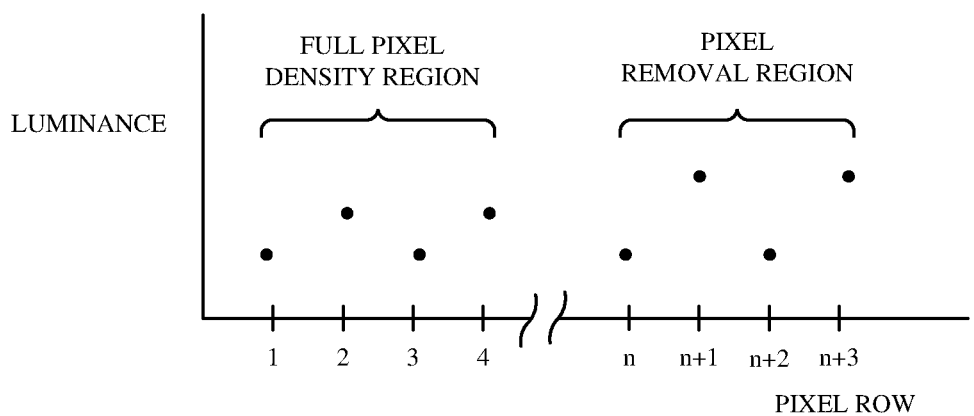

In illustrative pulse scheme of FIG. 29A, pixel rows (e.g., rows 1-4) in the full pixel density region of the display have the same pulse scheme (e.g., alternating 'a' pulses and 'b' pulses) as pixel rows (e.g., rows N through N+3) in the pixel removal region of the display. As shown in FIG. 29B, the luminance variations in full pixel density region 334 are mitigated (similar to as in FIGS. 28A and 28B). However, there may be luminance variations of a larger magnitude in pixel removal region 332 when using the same pulse scheme as in full pixel density region 334.

Figure 30A:
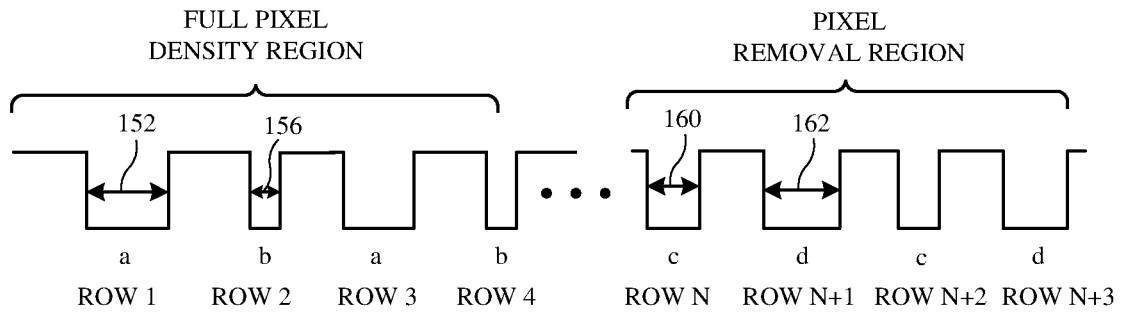
FIGS. 30A-30C show illustrative pulse schemes that are different in the full pixel density region than in the pixel removal region and corresponding mitigated row-to-row luminance variations in accordance with an embodiment.

Therefore, in addition to alternating rows receiving pulses having different properties, different regions of the display may have pulses with different properties. FIG. 30A is a diagram of how pulses may have different timing in different regions of the display. As shown in FIG. 30A, in the full pixel density region of the display, control signal B has a scheme similar to as shown in FIGS. 28A and 29A. As shown, the control signal may have a corresponding pulse 'a' for every other row (e.g., each odd numbered row). The control signal may have a corresponding pulse 'b' for every other row (e.g., each even numbered row). Pulse 'a' may involve the signal being pulsed for a length of time 152. Pulse 'b' may involve the signal being pulsed for a length of time 156 that is different than length of time 152. Every other row may receive a pulse 'a' and every other row may receive a pulse 'b.' In other words, the pulses alternate between pulse 'a' and pulse 'b' with alternating rows in the full pixel density region.

In the pixel removal region of the display, control signal B has a different scheme than in the full pixel density region. As shown, the control signal may have a corresponding pulse 'c' for every other row. The control signal may have a corresponding pulse 'd' for every other row. Pulse 'c' may involve the signal being pulsed for a length of time 160. Pulse 'd' may involve the signal being pulsed for a length of time 162 that is different than length of time 160. Every other row may receive a pulse 'c' and every other row may receive a pulse 'd.' In other words, the pulses alternate between pulse 'c' and pulse 'd' with alternating rows in the pixel removal region.

Lengths of time 162 and/or 160 may be different than lengths of time 152 and/or 156. The ratio of time 162 to 160 may be different than the ratio of time 156 to 152. Lengths of time 160 and 162 may be optimized to mitigate luminance differences between adjacent rows within the pixel removal region of the display.

Figure 30B:
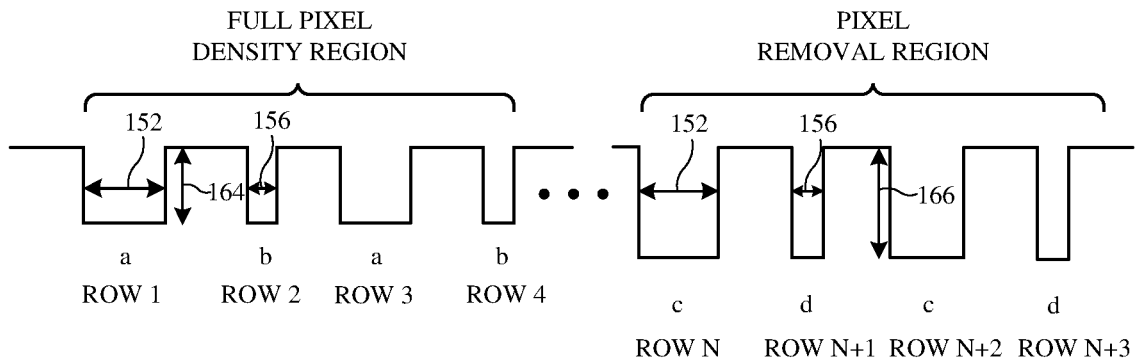

The example in FIG. 30A of the pulse timing changing in the pixel removal region is merely illustrative. In another embodiment, shown in FIG. 30B, the pulse timing stays the same but the control signal voltage difference changes. As shown in FIG. 30B, the pulse length of each pulse 'c' is length of time 152 (e.g., the same as pulse 'a'). Similarly, the pulse length of each pulse 'd' is length of time 156 (e.g., the same as pulse 'b').

However, in the full pixel density region there is a first voltage difference 164 between the on and off voltages of the control signal. In the pixel removal region, there is a second voltage difference 166 between the on and off voltages of the control signal. Voltage differences 164 and 166 are different (e.g., difference 166 may be greater than or less than difference 164). The voltage difference 166 may be optimized to mitigate luminance differences between adjacent rows within the pixel removal region of the display.

Figure 30C:
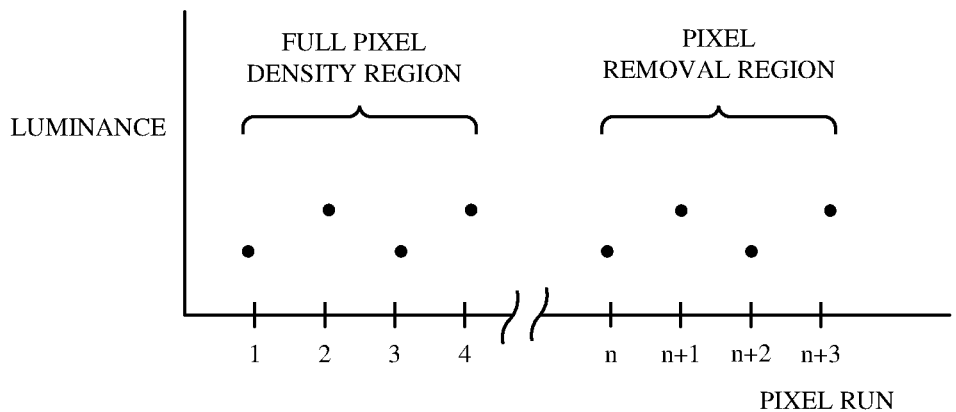

As shown in FIG. 30C, the luminance variations in both the full pixel density region 334 and the pixel removal region 332 are mitigated when a pulse scheme of the type shown in FIG. 30A or FIG. 30B is used. In FIG. 30C, the row-to-row luminance variations in the pixel removal region 332 may be similar in magnitude to the row-to-row luminance variations in the full pixel density region 334.

Figure 31:
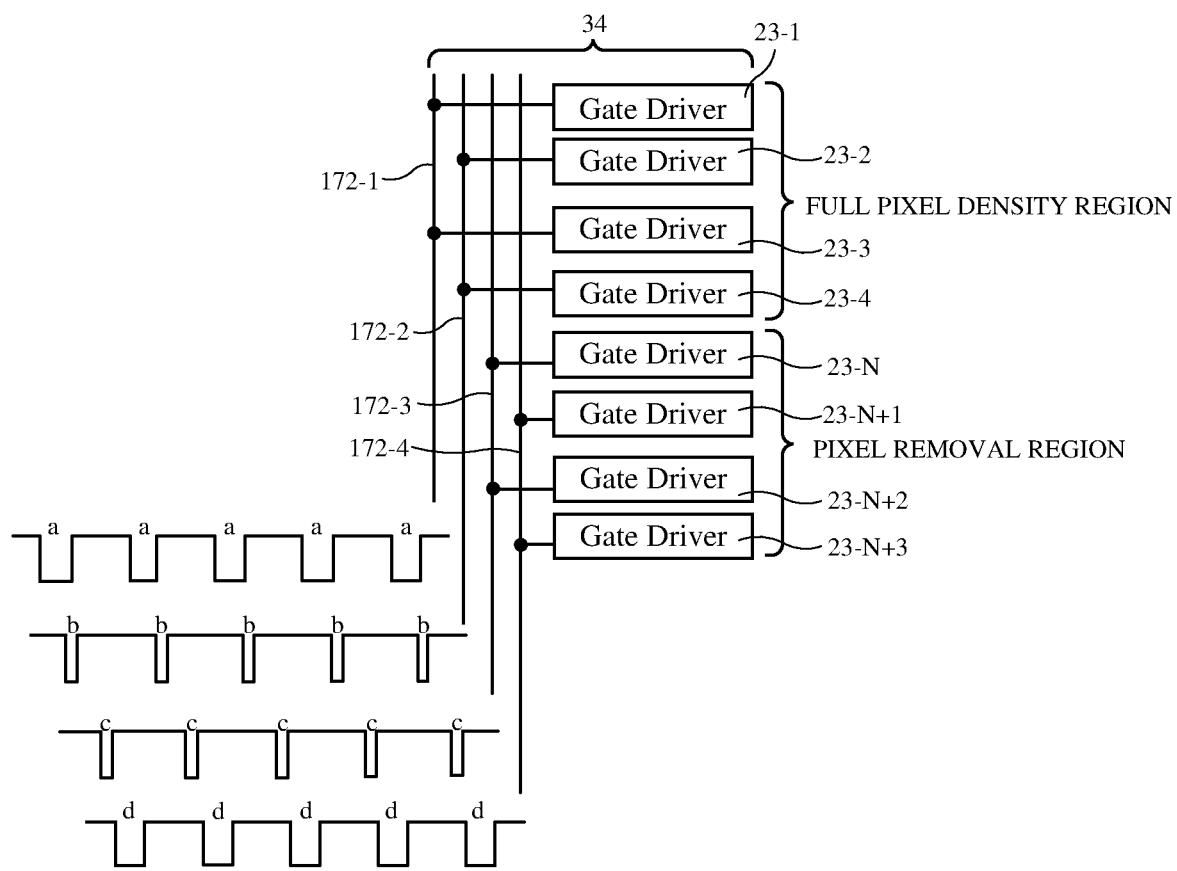
FIGS. 31 and 32 are diagrams of illustrative gate driving circuitry that may be used to implement different pulse schemes in the full pixel density region than in the pixel removal region in accordance with an embodiment.

FIG. 31 shows an illustrative example for how to implement the pulse scheme of FIGS. 30A-30C. As shown, the display may include a plurality of clock signal lines 172 (sometimes referred to as clock signal paths, signal paths, signal lines, etc.). Each clock signal line may have a corresponding clock signal. The clock signal lines may be coupled to, for example, display driver circuitry (e.g., display driver circuitry 30 in FIG. 2) that provides the clock signals over the clock signal lines. As shown in FIG. 31, clock signal line 172-1 has a corresponding clock signal with 'a' pulses, clock signal line 172-2 has a corresponding clock signal with 'b' pulses, clock signal line 172-3 has a corresponding clock signal with 'c' pulses, and clock signal line 172-4 has a corresponding clock signal with 'd' pulses. Each gate driver may be coupled to the appropriate clock signal line for that gate driver. For example, gate driver 23-1 in full pixel density region 334 is coupled to clock signal line 172-1 and therefore receives 'a' pulses. Gate driver 23-2 in full pixel density region 334 is coupled to clock signal line 172-2 and therefore receives 'b' pulses. Gate driver 23-3 in full pixel density region 334 is coupled to clock signal line 172-1 and therefore receives 'a' pulses. Gate driver 23-4 in full pixel density region 334 is coupled to clock signal line 172-2 and therefore receives 'b' pulses. Gate driver 23-N in pixel removal region 332 is coupled to clock signal line 172-3 and therefore receives 'c' pulses. Gate driver 23-N+1 in pixel removal region 332 is coupled to clock signal line 172-4 and therefore receives 'd' pulses. Gate driver 23-N+2 in pixel removal region 332 is coupled to clock signal line 172-3 and therefore receives 'c' pulses. Gate driver 23-N+4 in pixel removal region 332 is coupled to clock signal line 172-4 and therefore receives 'd' pulses.

Figure 32:
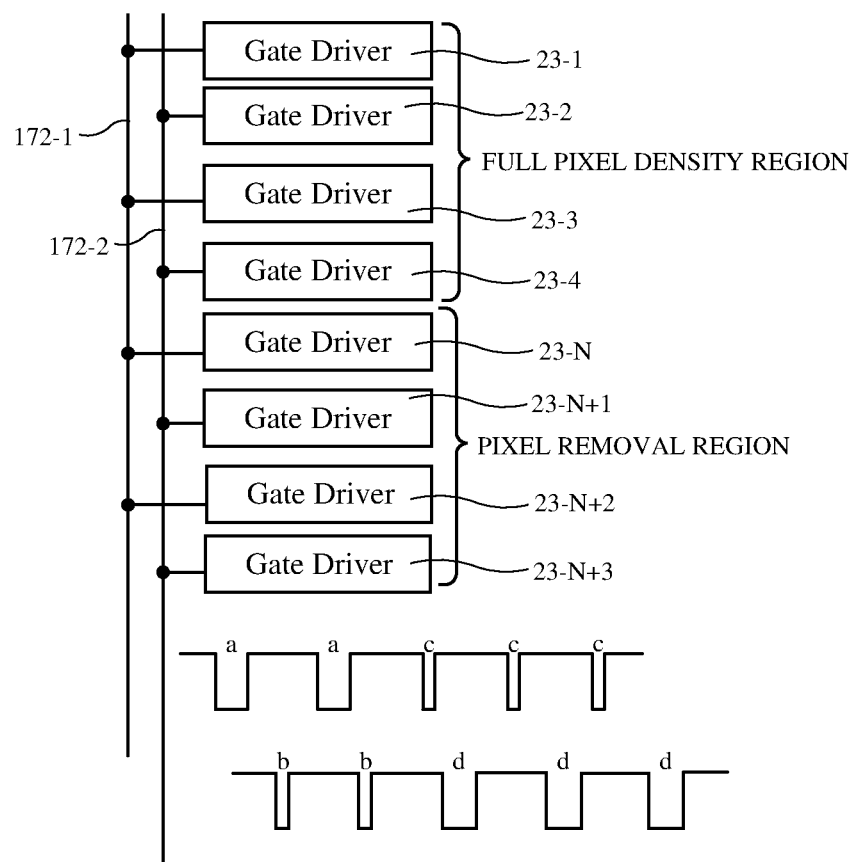

In FIG. 31, four clock signal lines are included to distribute the four pulse types to the gate drivers. In another example, shown in FIG. 32, two clock signal lines are included to distribute the four pulse types to the gate drivers. As shown in FIG. 32, clock signal line 172-1 has a corresponding clock signal that varies between 'a' pulses and 'c' pulses. Clock signal line 172-2 has a corresponding clock signal that varies between 'b' pulses and 'd' pulses. Each gate driver may be coupled to the appropriate clock signal line for that gate driver. For example, gate drivers 23-1 and 23-3 in full pixel density region 334 are coupled to clock signal line 172-1 and therefore receive 'a' pulses (due to the variable timing of the clock signal). Gate drivers 23-2 and 23-4 in full pixel density region 334 are coupled to clock signal line 172-2 and therefore receive 'b' pulses (due to the variable timing of the clock signal). Gate drivers 23-N and 23-N+2 in pixel removal region 332 are also coupled to clock signal line 172-1 and receive 'c' pulses (due to the variable timing of the clock signal). Gate drivers 23-N+1 and 23-N+3 in pixel removal region 332 are coupled to clock signal line 172-2 and therefore receive 'd' pulses (due to the variable timing of the clock signal).

Figure 33:
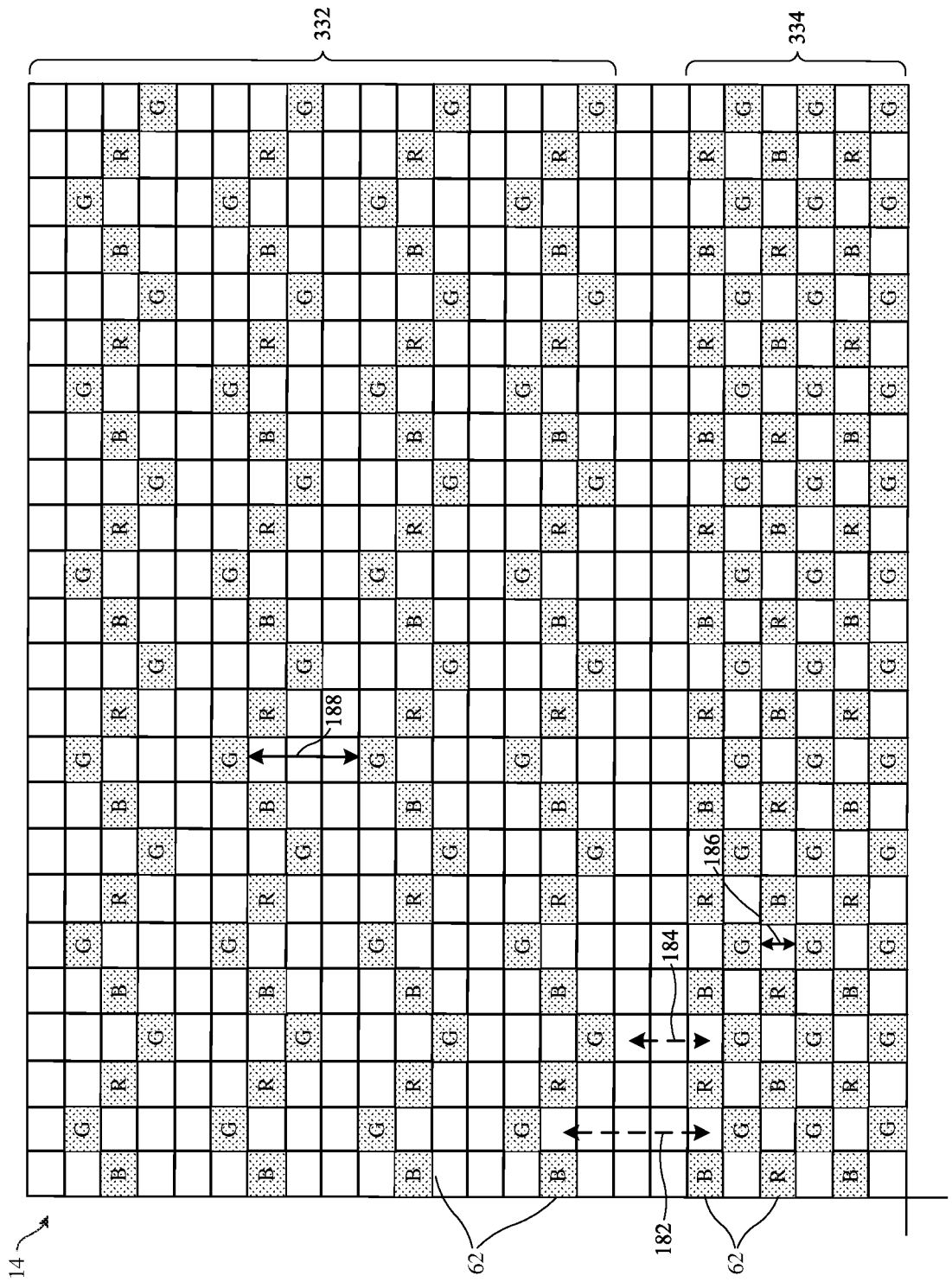
FIG. 33 is a top view of an illustrative display without a transition region between a full pixel density region and pixel removal region in accordance with an embodiment.
Figure 34:
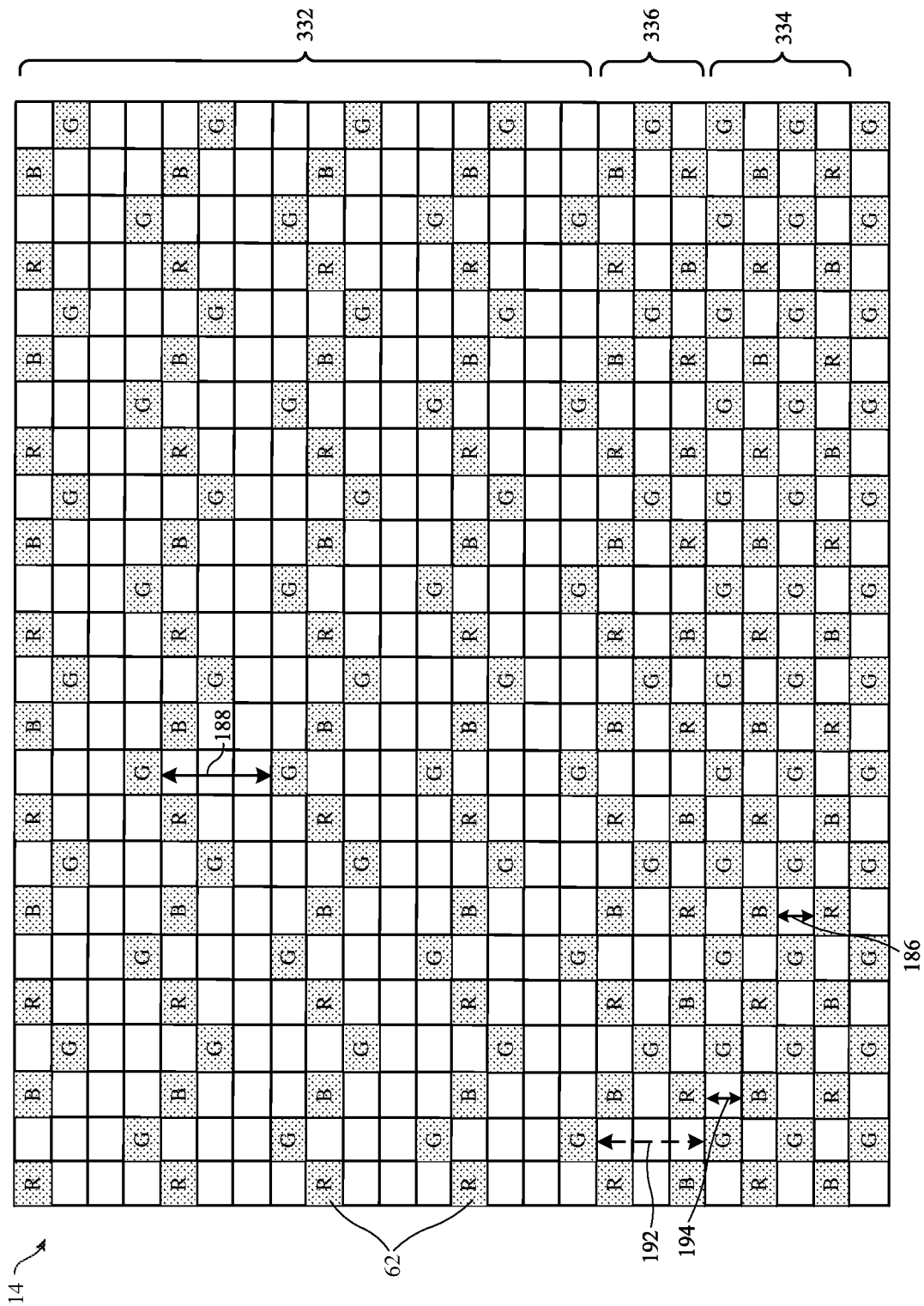
FIG. 34 is a top view of an illustrative display with a transition region between a full pixel density region and pixel removal region in accordance with an embodiment.

FIGS. 33 and 34 are top views of a display showing illustrative pixel arrangements between the pixel removal region and full pixel density region. FIGS. 33 and 34 show emissive layer sub-pixels 62. As shown, in full pixel density portion 334 the emissive layer sub-pixels 62 may be arranged in a checkerboard pattern. Adjacent green pixels may be separated by distance 186 (e.g., 1 pixel-width). In FIG. 33, there is no transition region between full pixel density region 334 and pixel removal region 332 (which has a horizontal zig-zag arrangement as shown previously). Adjacent green pixels between the full pixel density region 334 and pixel removal region 332 may be separated by distances 182 (e.g., 5 pixel-widths separate the adjacent green pixels) and 184 (e.g., 3 pixel-widths separate the adjacent green pixels). In pixel removal region 332, adjacent green pixels may be separated by distance 188 (e.g., 3 pixel-widths).

In FIG. 34, transition region 336 is included between full pixel density region 334 and pixel removal region 332. Similar to as in FIG. 33, in FIG. 34 adjacent green pixels may be separated by distance 186 (e.g., 1 pixel-width) in full pixel density region 334 and by distance 188 (e.g., 3 pixel-widths) in pixel removal region 332. However, in transition region 336 adjacent green pixels between the full pixel density region 334 and pixel removal region 332 may be separated by distances 192 (e.g., 3 pixel-widths separate the adjacent green pixels) and 194 (e.g., 1 pixel-width separate the adjacent green pixels). In other words, the pixel separation is smaller in transition region 336 in FIG. 34 than between the pixels in full pixel density region 334 and pixel removal region 332 in FIG. 33.

As described above, one aspect of the present technology is the gathering and use of information such as information from input-output devices. The present disclosure contemplates that in some instances, data may be gathered that includes personal information data that uniquely identifies or can be used to contact or locate a specific person. Such personal information data can include demographic data, location-based data, telephone numbers, email addresses, twitter ID's, home addresses, data or records relating to a user's health or level of fitness (e.g., vital signs measurements, medication information, exercise information), date of birth, username, password, biometric information, or any other identifying or personal information.

The present disclosure recognizes that the use of such personal information, in the present technology, can be used to the benefit of users. For example, the personal information data can be used to deliver targeted content that is of greater interest to the user. Accordingly, use of such personal information data enables users to calculated control of the delivered content. Further, other uses for personal information data that benefit the user are also contemplated by the present disclosure. For instance, health and fitness data may be used to provide insights into a user's general wellness, or may be used as positive feedback to individuals using technology to pursue wellness goals.

The present disclosure contemplates that the entities responsible for the collection, analysis, disclosure, transfer, storage, or other use of such personal information data will comply with well-established privacy policies and/or privacy practices. In particular, such entities should implement and consistently use privacy policies and practices that are generally recognized as meeting or exceeding industry or governmental requirements for maintaining personal information data private and secure. Such policies should be easily accessible by users, and should be updated as the collection and/or use of data changes. Personal information from users should be collected for legitimate and reasonable uses of the entity and not shared or sold outside of those legitimate uses. Further, such collection/sharing should occur after receiving the informed consent of the users. Additionally, such entities should consider taking any needed steps for safeguarding and securing access to such personal information data and ensuring that others with access to the personal information data adhere to their privacy policies and procedures. Further, such entities can subject themselves to evaluation by third parties to certify their adherence to widely accepted privacy policies and practices. In addition, policies and practices should be adapted for the particular types of personal information data being collected and/or accessed and adapted to applicable laws and standards, including jurisdiction-specific considerations. For instance, in the United States, collection of or access to certain health data may be governed by federal and/or state laws, such as the Health Insurance Portability and Accountability Act (HIPAA), whereas health data in other countries may be subject to other regulations and policies and should be handled accordingly. Hence different privacy practices should be maintained for different personal data types in each country.

Despite the foregoing, the present disclosure also contemplates embodiments in which users selectively block the use of, or access to, personal information data. That is, the present disclosure contemplates that hardware and/or software elements can be provided to prevent or block access to such personal information data. For example, the present technology can be configured to allow users to select to "opt in" or "opt out" of participation in the collection of personal information data during registration for services or anytime thereafter. In another example, users can select not to provide certain types of user data. In yet another example, users can select to limit the length of time user-specific data is maintained. In addition to providing "opt in" and "opt out" options, the present disclosure contemplates providing notifications relating to the access or use of personal information. For instance, a user may be notified upon downloading an application ("app") that their personal information data will be accessed and then reminded again just before personal information data is accessed by the app.

Moreover, it is the intent of the present disclosure that personal information data should be managed and handled in a way to minimize risks of unintentional or unauthorized access or use. Risk can be minimized by limiting the collection of data and deleting data once it is no longer needed. In addition, and when applicable, including in certain health related applications, data de-identification can be used to protect a user's privacy. De-identification may be facilitated, when appropriate, by removing specific identifiers (e.g., date of birth, etc.), controlling the amount or specificity of data stored (e.g., collecting location data at a city level rather than at an address level), controlling how data is stored (e.g., aggregating data across users), and/or other methods.

Therefore, although the present disclosure broadly covers use of information that may include personal information data to implement one or more various disclosed embodiments, the present disclosure also contemplates that the various embodiments can also be implemented without the need for accessing personal information data. That is, the various embodiments of the present technology are not rendered inoperable due to the lack of all or a portion of such personal information data.

In accordance with an embodiment, an electronic device is provided that includes a display having an array of pixels, the display has a first portion having a first pixel density, a second portion having a second pixel density that is lower than the first pixel density, and a third portion having a third pixel density that is lower than the first pixel density, a first sensor that senses light that passes through the second portion of the display, the second portion of the display includes a first plurality of transparent openings arranged according to a first pattern, and a second sensor that senses light that passes through the third portion of the display, the third portion of the display includes a second plurality of transparent openings arranged according to a second pattern that is different than the first pattern.

In accordance with another embodiment, in the first pattern, the first plurality of transparent openings extend in a first direction and, in the second pattern, the second plurality of transparent openings extend in a second direction that is different than the first direction.

In accordance with another embodiment, the second direction is orthogonal to the first direction.

In accordance with another embodiment, the display has first and second opposing edges connected by third and fourth opposing edges, the first direction is a vertical direction that extends between the first and second edges and the second direction is a horizontal direction that extends between the third and fourth edges.

In accordance with another embodiment, the display has first and second opposing edges connected by third and fourth opposing edges, the first direction is a diagonal direction that extends at a non-parallel, non-orthogonal angle relative to the first and second edges.

In accordance with another embodiment, the second portion of the display includes a plurality of rows, every other row in the second portion includes three thin-film transistor sub-pixels and one transparent opening in a repeating pattern, and every other row in the second portion includes one thin-film transistor sub-pixel and three transparent openings in a repeating pattern.

In accordance with another embodiment, the second portion of the display includes emissive layer sub-pixels arranged in a horizontal zig-zag pattern and the first plurality of transparent openings extend horizontally.

In accordance with another embodiment, the second portion of the display includes emissive layer sub-pixels arranged in a horizontal zig-zag pattern and the first plurality of transparent openings extend vertically.

In accordance with another embodiment, the first pattern includes the first plurality of transparent openings and a plurality of thin-film transistor sub-pixels arranged in a checkerboard pattern.

In accordance with another embodiment, the display includes signal lines and each signal line in the second portion has vertical segments and horizontal segments connecting the vertical segments.

In accordance with another embodiment, the electronic device includes a plurality of signal lines, each signal line in the second portion of the display includes a plurality of first segments and a plurality of second segments and each one of the second segments is at a non-orthogonal angle relative to two respective, adjacent first segments.

In accordance with another embodiment, the second portion of the display includes emissive layer sub-pixels arranged in a vertical zig-zag pattern.

In accordance with another embodiment, the second portion of the display includes emissive layer sub-pixels arranged according to a third pattern and the third portion of the display includes emissive layer sub-pixels arranged according to a fourth pattern that is different than the third pattern.

In accordance with another embodiment, the third pattern includes a horizontal zig-zag pattern and the fourth pattern includes a vertical zig-zag pattern.

In accordance with another embodiment, the second portion of the display includes signal lines arranged according to a third pattern and the third portion of the display includes signal lines arranged according to a fourth pattern that is different than the third pattern.

In accordance with another embodiment, the electronic device includes a thin-film transistor circuitry layer including a plurality of conductive layers and a light absorbing layer on at least one of the conductive layers.

In accordance with another embodiment, the electronic device includes a thin-film transistor circuitry layer including a plurality of conductive layers, at least one of the conductive layers is transparent in the second portion of the display.

In accordance with another embodiment, a density of the array of pixels gradually transitions between the first pixel density in the first portion of the display and the second pixel density in the second portion of the display.

In accordance with an embodiment, a display is provided that includes a first row of pixels formed in an active area, a second row of pixels, a first portion of which is formed on a first side of a transparent window within the active area and a second portion of which is formed on a second side of the transparent window, and a display driver circuit configured to output a control signal, the control signal is conveyed to the first row of pixels via a control line that extends across an entire width of the active area, the control signal is conveyed to the first portion of the second row of pixels via a first control line segment that is coupled to the display driver circuit, and the control signal is conveyed to the second portion of the second row of pixels via a second control line segment that is coupled to the control line.

In accordance with another embodiment, the display includes a loopback segment connecting the control line to the second control line segment.

In accordance with another embodiment, the loopback segment is perpendicular to the control line.

In accordance with another embodiment, the loopback segment is formed outside the active area.

In accordance with another embodiment, the first row of pixels receives a first pulse of an additional control signal, the second row of pixels receives a second pulse of the additional controls signal, and the first pulse and second pulse have different durations.

In accordance with an embodiment, an electronic device is provided that includes a display having an array of pixels, the display has a full pixel density region, a first pixel removal region having a lower density than the full pixel density region, and a second pixel removal region having a lower density than the full pixel density region, a first optical sensor that is overlapped by the first pixel removal region and that captures an image through the first pixel removal region, a second optical sensor that is overlapped by the second pixel removal region and that captures an image through the second pixel removal region, and control circuitry that is configured to use the image from the second optical sensor to remove diffraction artifacts from the image from the first optical sensor.

The foregoing is merely illustrative and various modifications can be made by those skilled in the art without departing from the scope and spirit of the described embodiments. The foregoing embodiments may be implemented individually or in any combination.

What is claimed is:

1. An electronic device, comprising:
    a display having an array of pixels, wherein the display has a first portion having a first pixel density, a second portion having a second pixel density that is lower than the first pixel density, and a third portion having a third pixel density that is lower than the first pixel density;
    a first sensor that senses light that passes through the second portion of the display, wherein the second portion of the display includes a first plurality of transparent openings arranged according to a first pattern;
    a second sensor that senses light that passes through the third portion of the display, wherein the third portion of the display includes a second plurality of transparent openings arranged according to a second pattern that is different than the first pattern and wherein the electronic device is configured to use an image captured from the second optical sensor to remove diffraction artifacts from an image captured from the first optical sensor.

2. The electronic device defined in claim 1, wherein, in the first pattern, the first plurality of transparent openings extend in a first direction and wherein, in the second pattern, the second plurality of transparent openings extend in a second direction that is different than the first direction.

3. The electronic device defined in claim 2, wherein the second direction is orthogonal to the first direction.

4. The electronic device defined in claim 2, wherein the display has first and second opposing edges connected by third and fourth opposing edges, wherein the first direction is a diagonal direction that extends at a non-parallel, non-orthogonal angle relative to the first and second edges.

5. The electronic device defined in claim 1, wherein the second portion of the display comprises a plurality of rows, wherein every other row in the second portion includes three thin-film transistor sub-pixels and one transparent opening in a repeating pattern, and wherein every other row in the second portion includes one thin-film transistor sub-pixel and three transparent openings in a repeating pattern.

6. The electronic device defined in claim 1, wherein the second portion of the display comprises emissive layer sub-pixels arranged in a horizontal zig-zag pattern and wherein the first plurality of transparent openings extends horizontally.

7. The electronic device defined in claim 1, wherein the second portion of the display comprises emissive layer sub-pixels arranged in a horizontal zig-zag pattern and wherein the first plurality of transparent openings extends vertically.

8. The electronic device defined in claim 1, wherein the first pattern comprises the first plurality of transparent openings and a plurality of thin-film transistor sub-pixels arranged in a checkerboard pattern.

9. The electronic device defined in claim 8, wherein the display comprises signal lines and wherein each signal line in the second portion has vertical segments and horizontal segments connecting the vertical segments.

10. The electronic device defined in claim 1, further comprising:
a plurality of signal lines, wherein each signal line in the second portion of the display includes a plurality of first segments and a plurality of second segments and wherein each one of the second segments is at a non-orthogonal angle relative to two respective, adjacent first segments.

11. The electronic device defined in claim 1, wherein the second portion of the display comprises emissive layer sub-pixels arranged in a vertical zig-zag pattern.

12. The electronic device defined in claim 1, wherein the second portion of the display includes emissive layer sub-pixels arranged according to a third pattern and wherein the third portion of the display includes emissive layer sub-pixels arranged according to a fourth pattern that is different than the third pattern.

13. The electronic device defined in claim 12, wherein the third pattern comprises a horizontal zig-zag pattern and wherein the fourth pattern comprises a vertical zig-zag pattern.

14. The electronic device defined in claim 1, wherein the second portion of the display includes signal lines arranged according to a third pattern and wherein the third portion of the display includes signal lines arranged according to a fourth pattern that is different than the third pattern.

15. The electronic device defined in claim 1, further comprising:
a thin-film transistor circuitry layer comprising a plurality of conductive layers and a light absorbing layer on at least one of the conductive layers, wherein at least one of the conductive layers is transparent in the second portion of the display.

16. The electronic device defined in claim 1, wherein a density of the array of pixels gradually transitions between the first pixel density in the first portion of the display and the second pixel density in the second portion of the display.

17. An electronic device, comprising:
a display having an array of pixels, wherein the display has a full pixel density region, a first pixel removal region having a lower density than the full pixel density region, and a second pixel removal region having a lower density than the full pixel density region;
a first optical sensor that is overlapped by the first pixel removal region and that captures an image through the first pixel removal region;
a second optical sensor that is overlapped by the second pixel removal region and that captures an image through the second pixel removal region; and
control circuitry that is configured to use the image from the second optical sensor to remove diffraction artifacts from the image from the first optical sensor.

* * * * *